(12) United States Patent
Werner

(10) Patent No.: US 11,921,559 B2
(45) Date of Patent: Mar. 5, 2024

(54) POWER GRID DISTRIBUTION FOR TENSOR STREAMING PROCESSORS

(71) Applicant: Groq, Inc., Mountain View, CA (US)

(72) Inventor: Jeffrey Werner, San Jose, CA (US)

(73) Assignee: Groq, Inc., Mountain View, CA (US)

( * ) Notice: Subject to any disclaimer, the term of this patent is extended or adjusted under 35 U.S.C. 154(b) by 121 days.

(21) Appl. No.: 17/732,408

(22) Filed: Apr. 28, 2022

(65) Prior Publication Data

US 2022/0365582 A1 Nov. 17, 2022

Related U.S. Application Data

(60) Provisional application No. 63/183,158, filed on May 3, 2021.

(51) Int. Cl.
*G06F 1/3206* (2019.01)
*G06F 9/38* (2018.01)
*G06N 20/00* (2019.01)

(52) U.S. Cl.
CPC .......... *G06F 1/3206* (2013.01); *G06F 9/3887* (2013.01); *G06N 20/00* (2019.01)

(58) Field of Classification Search
CPC .... G06F 1/3206; G06F 9/3887; G06F 30/392; G06N 20/00
USPC ........................................................ 713/320
See application file for complete search history.

(56) References Cited

U.S. PATENT DOCUMENTS

| | | | | |
|---|---|---|---|---|
| 3,366,929 A | * | 1/1968 | Mullery | G06F 9/4486 712/E9.083 |
| 4,507,726 A | * | 3/1985 | Grinberg | G06F 15/8023 712/11 |
| 4,748,585 A | * | 5/1988 | Chiarulli | G06F 7/57 712/15 |
| 4,992,933 A | * | 2/1991 | Taylor | G06F 9/3887 712/E9.035 |
| 5,253,308 A | * | 10/1993 | Johnson | G06F 15/8023 382/307 |
| 5,288,949 A | * | 2/1994 | Crafts | H01L 23/5386 174/250 |
| 5,708,835 A | * | 1/1998 | Burnett | G06F 15/17381 712/21 |
| 5,825,677 A | * | 10/1998 | Agarwal | G06F 15/8023 708/520 |
| 5,842,034 A | * | 11/1998 | Bolstad | G06F 13/4022 712/12 |

(Continued)

*Primary Examiner* — Paul R. Myers
(74) *Attorney, Agent, or Firm* — Amin, Turocy & Watson, LLP

(57) ABSTRACT

Embodiments are directed to a power grid distribution for a deterministic processor. The deterministic processor includes a plurality of functional slices, a plurality of data transport lanes for transporting data across the functional slices along a first spatial dimension, and a plurality of instruction control units (ICUs). An instruction in each subset of the ICUs includes a functional slice specific operation code and is transported to a corresponding functional slice along a second spatial dimension orthogonal to the first spatial dimension. A power supply grid of metal traces is spread across the first and second spatial dimensions for supplying power to the functional slices and the ICUs. At least a portion of the metal traces are routed as discontinuous stubs along the first spatial dimension or the second spatial dimension.

20 Claims, 12 Drawing Sheets

(56) References Cited

U.S. PATENT DOCUMENTS

| | | | | |
|---|---|---|---|---|
| 6,128,720 | A * | 10/2000 | Pechanek | G06F 9/30185 712/15 |
| 6,223,277 | B1 * | 4/2001 | Karguth | G06F 9/30109 712/34 |
| 6,255,845 | B1 * | 7/2001 | Wong | H03K 19/1736 326/38 |
| 6,321,371 | B1 * | 11/2001 | Yount, Jr. | H01L 27/0207 716/112 |
| 6,617,243 | B1 * | 9/2003 | Weekly | H01L 23/49838 257/773 |
| 7,480,888 | B1 * | 1/2009 | Ogilvie | G06F 30/34 716/101 |
| 7,943,436 | B2 * | 5/2011 | McElvain | G06F 30/394 257/659 |
| 9,146,747 | B2 * | 9/2015 | Moloney | G06F 12/0238 |
| 9,697,463 | B2 * | 7/2017 | Ross | G06N 3/063 |
| 9,852,989 | B1 * | 12/2017 | Lin | H01L 23/5226 |
| 2007/0187468 | A1 * | 8/2007 | Douriet | H05K 1/162 228/110.1 |
| 2008/0140999 | A1 * | 6/2008 | Gong | G06F 9/3879 712/214 |
| 2011/0267866 | A1 * | 11/2011 | Carter | G11C 5/06 365/63 |
| 2014/0123147 | A1 * | 5/2014 | Pantaleoni | G06F 16/90344 707/741 |
| 2014/0195997 | A1 * | 7/2014 | Tseng | G06F 30/39 716/122 |
| 2014/0252650 | A1 * | 9/2014 | Utsumi | H01L 23/5286 257/774 |
| 2014/0332971 | A1 * | 11/2014 | Tseng | H01L 23/4824 257/773 |
| 2015/0149976 | A1 * | 5/2015 | Tien | G06F 30/392 716/120 |
| 2016/0291974 | A1 * | 10/2016 | Lingam | G06F 9/30098 |
| 2017/0177352 | A1 * | 6/2017 | Ould-Ahmed-Vall | G06F 9/30032 |
| 2017/0220719 | A1 * | 8/2017 | Elrabaa | G06F 30/33 |
| 2018/0329479 | A1 * | 11/2018 | Meixner | G06T 7/73 |
| 2019/0213298 | A1 * | 7/2019 | Correale, Jr. | G06F 30/394 |
| 2021/0167014 | A1 * | 6/2021 | Sreedhar | H01L 23/5286 |

* cited by examiner

700

Route a power supply grid of metal traces across a first spatial dimension and a second spatial dimension orthogonal to the first spatial dimension for supplying power to a plurality of functional slices of a processor and a plurality of instruction control units (ICUs) of the processor
710

Route at least a portion of the metal traces as discontinuous stubs along the first spatial dimension or the second spatial dimension
720

POWER GRID DISTRIBUTION FOR TENSOR STREAMING PROCESSORS

CROSS-REFERENCE TO RELATED APPLICATIONS

This application claims a benefit and priority to U.S. Provisional Patent Application Ser. No. 63/183,158, filed on May 3, 2021, entitled "Integrated Circuit Power Distribution Apparatus and Method", which is hereby incorporated by reference in its entirety.

TECHNICAL FIELD

The present disclosure generally relates to a processor architecture, and more specifically to power grid distribution for tensor streaming processors.

BACKGROUND

Over the last decade, data center operators have installed multicore processor systems in warehouse-scale computers. These systems have dozens to thousands of processing cores that vary widely in form and function, are used in powerful graphical processing units (GPUs), tensor processing units (TPUs), field programmable gate arrays (FPGAs), with many using data network controllers for efficient remote memory access. Such systems are often used for accelerating deep neural network training and inference (application of the trained neural network) performance for a wide range of uses in commerce, for example, convolutional neural networks (CNNs) for recommendation algorithms, computer vision and image classification for product searching; and recurrent neural networks (RNNs) for natural language processing in user interfaces. The heightened computational requirements of these models, many of which involve very large numbers of vector and matrix calculations, when used for millions of consumers and billions of transactions, have been the catalyst for a resurgence of architectural innovation.

In a conventional chip multiprocessor (CMP), processing cores are interconnected using an on-chip network to exchange data between all of the processing cores. In this simple load-store model, a set of general-purpose data registers are used as intermediate storage between the main memory systems and the processor cores, which can include arithmetic logic units (ALUs), that operate on data. Instructions are dispatched to each core and executed by the local integer or floating-point processing modules, while intermediate results are stored in the general-purpose registers. This load-store architecture moves data (also referred to as 'operands') and computed results between the registers and main memory. Instruction execution is often carried out over several stages: 1) instruction fetch, 2) instruction decode, 3) execution on ALUs, 4) memory read, and 5) memory write to update the results in the registers.

However, workloads for CMPs continue to grow both in size and complexity, presenting serious scalability, performance, and usability demands for traditional CMP architectures. Efficiently managing this demand requires abundant on-chip ALUs for the vector and matrix calculations, used at near-peak performance levels throughout program execution. Unfortunately, hardware complexity from added ALUs and other components substantially increased scheduling difficulties within many of these architectures. In turn, this impedes system performance as it is difficult to prevent runtime stalls. Furthermore, while architectural enhancements such as caches, branch predictors, and prefetchers help tremendously in improving performance, they do not bound worst-case performance.

SUMMARY

Embodiments of the present disclosure are directed to an integrated circuit with one or more deterministic processors (e.g., tensor streaming processors (TSPs) or artificial intelligence processors) each having a functional slice architecture. In some embodiments, each deterministic processor is configured to process a machine learning model. Each deterministic processor is divided into a plurality of functional units organized into a plurality of functional slices. Each functional slice is configured to perform specific functions within the deterministic processor, which may include memory functional slices (MEMs) for storing operand data, arithmetic functional slices for performing operations on received operand data (e.g., vector processing, matrix manipulation), and/or the like. Functional units of the deterministic processor are configured to stream operand data across a first (e.g., temporal) dimension in a direction indicated in a corresponding instruction, and receive instructions across a second (e.g., spatial) dimension. The compiler for the deterministic processor is aware of the hardware configuration of the deterministic processor, and configures the timing of data and instruction flows such that corresponding data and instructions are intersected at each computational element at a predetermined time. Each functional slice of the deterministic processor may operate on a set of data lanes in a Single Instruction Multiple Data (SIMD) manner. The set of data lanes can be referred to herein as a "superlane" and represents a cross-section of all the functional slices on a processor chip.

Embodiments of the present disclosure are directed to a power grid distribution for a deterministic processor (e.g., TSP). The deterministic processor includes a plurality of functional slices, a plurality of data transport lanes for transporting data across the functional slices along a first spatial dimension, a plurality of instruction control units (ICUs), an instruction in each subset of the ICUs comprising a functional slice specific operation code and is transported to a corresponding functional slice along a second spatial dimension orthogonal to the first spatial dimension, and a power supply grid of metal traces spreading across the first and second spatial dimensions for supplying power to the functional slices and the ICUs, at least a portion of the metal traces being discontinuous along the first spatial dimension or the second spatial dimension.

Embodiments of the present disclosure further relate to a process (or method) of routing a power grid for a deterministic processor (e.g., TSP). The process includes: routing a power supply grid of metal traces across a first spatial dimension and a second spatial dimension orthogonal to the first spatial dimension for supplying power to a plurality of functional slices of the deterministic processor and a plurality of ICUs of the deterministic processor, and routing at least a portion of the metal traces as discontinuous stubs along the first spatial dimension or the second spatial dimension, wherein a plurality of data transport lanes of the deterministic processor are configured to transport data across the functional slices along the first spatial dimension, and an instruction in each subset of the ICUs comprises a functional slice specific operation code and is configured for transportation to a corresponding functional slice along the second spatial dimension.

Embodiments of the present disclosure further relate to a non-transitory computer-readable storage medium comprising stored thereon computer executable instructions, which when executed by a computer processor cause the computer processor to: route a power supply grid of metal traces across a first spatial dimension and a second spatial dimension orthogonal to the first spatial dimension for supplying power to a plurality of functional slices of the deterministic processor and a plurality of ICUs of the deterministic processor, and route at least a portion of the metal traces as discontinuous stubs along the first spatial dimension or the second spatial dimension, wherein a plurality of data transport lanes of the deterministic processor are configured to transport data across the functional slices along the first spatial dimension, and an instruction in each subset of the ICUs comprises a functional slice specific operation code and is configured for transportation to a corresponding functional slice along the second spatial dimension.

BRIEF DESCRIPTION OF THE DRAWINGS

FIG. 7 is a flowchart illustrating a method of routing a power grid for an integrated circuit with a TSP, in accordance with some embodiments.

Figure 1A:
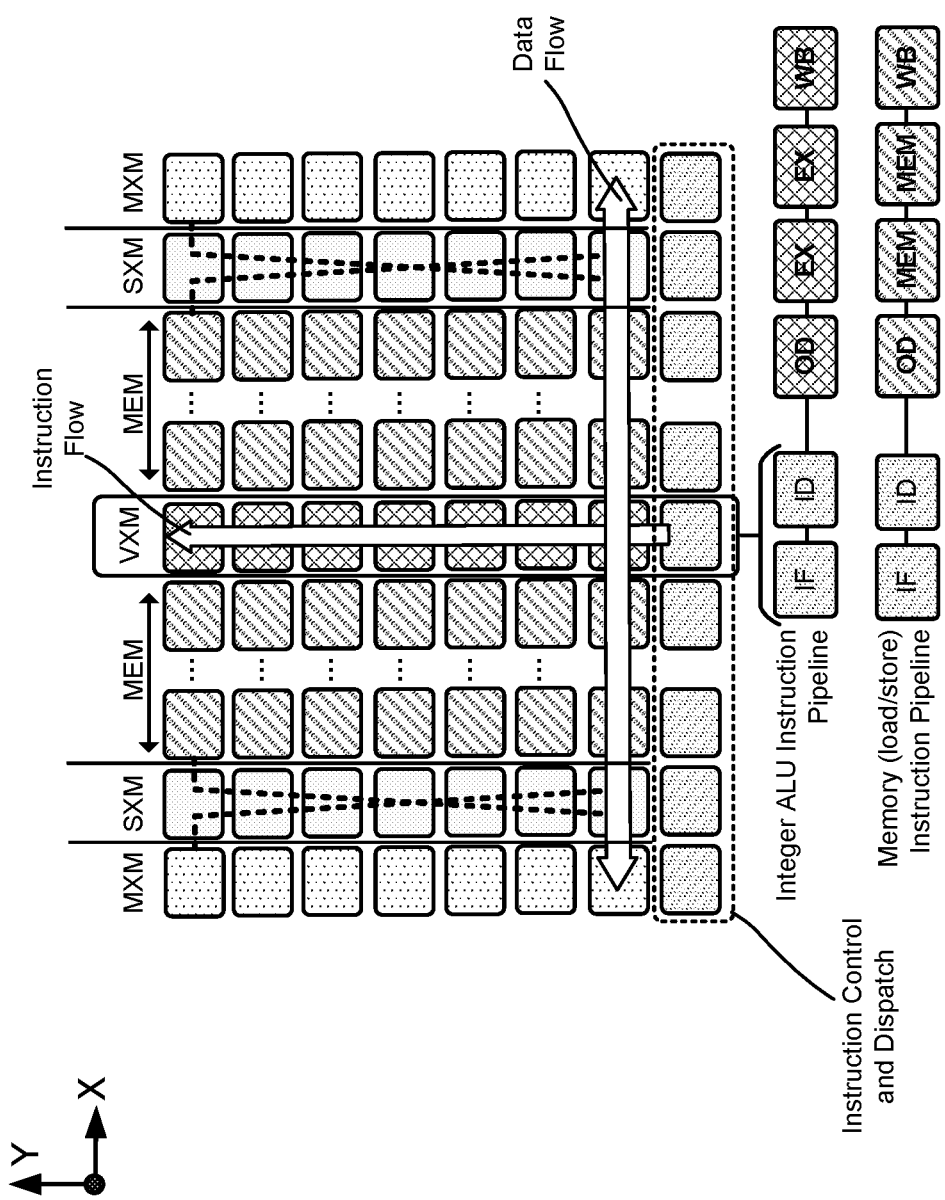
FIG. 1A illustrates an arrangement of functional slices in a tensor streaming processor (TSP), in accordance with some embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Introductory Overview

Disclosed are configurations that include an integrated circuit with one or more deterministic streaming processors (e.g., tensor streaming processors (TSPs) or artificial intelligence processors). Each deterministic streaming processor may have a functional slice architecture. In some embodiments, each deterministic streaming processor is configured to process a machine learning model. Each deterministic streaming processor is divided into a plurality of functional units. The functional units are organized into a plurality of functional slices. Each functional slice is configured to perform specific functions within the deterministic processor. The deterministic streaming processor may include memory functional slices (MEMs) for storing operand data, arithmetic functional slices for performing operations on received operand data (e.g., vector processing, matrix manipulation), and/or the like. Functional units of the deterministic streaming processor are configured to stream operand data across a first (e.g., temporal) dimension in a direction indicated in a corresponding instruction, and receive instructions across a second (e.g., spatial) dimension. The compiler for the deterministic streaming processor is aware of the hardware configuration of the deterministic streaming processor, and configures the timing of data and instruction flows such that corresponding data and instructions are intersected at each computational element at a predetermined time. Each functional slice of the deterministic streaming processor may operate on a set of data lanes in a Single Instruction Multiple Data (SIMD) manner. The set of data lanes can be referred to herein as a "superlane" and represents a cross-section of all the functional slices on a processor chip.

The disclosed embodiments are directed to a deterministic streaming processor having a functional slicing architecture. In some embodiments, the deterministic streaming processor may comprise a tensor streaming processor (TSP) having a functional slicing architecture, which may be used for hardware-accelerated machine learning (ML) applications.

The deterministic streaming processor (e.g., TSP) comprises a plurality of "computational elements," each computational element corresponding to a functional unit within the processor. The on-chip memory and network-on-chip (NoC) of the deterministic streaming processor architecture are fused to provide both storage of operands and results, and may act as a conduit for transferring operand and/or result data to/from the functional units of the deterministic streaming processor. The computational elements of the deterministic streaming processor are divided between different functionalities (e.g., memory, arithmetic operation, etc.), and are organized as functional slices which operate on multi-dimensional data (e.g., tensors). For example, each functional slice is composed from computational elements which border (or abut) each other, both horizontal and vertically, to form the functional slice. The number of computational elements and computation granularity of each computational element may be selected to take advantage of the underlying technology on which it is built. Taken together, the number of computational elements (N) and the word granularity (M) of a memory (e.g., static random-access memory (SRAM)) yields the vector length (VL) of the machine.

In some embodiments, each functional slice of the deterministic streaming processor functions independently, and receives instructions from an instruction control unit (ICU). The ICU may pass instructions to a first computational element of the functional slice, which are then propagated in a first temporal dimension of the deterministic streaming processor along the functional slice to the remaining computational elements of the functional slice. On the other hand, data operands for storage and/or processing may be passed between different functional slices of the deterministic streaming processor, in a second spatial dimension of the deterministic streaming processor perpendicular to the first temporal dimension. As such, the data flow and the instruction flow of the deterministic streaming processor are separate flows.

In some embodiments, a compiler for the deterministic streaming processor is aware of the hardware configuration of the deterministic streaming processor, and synchronizes the timing of data and instruction flows such that corresponding data and instructions are received at each computational element with a predetermined temporal relationship (e.g., during the same clock cycle, separated by a predetermined delay, etc.). In some embodiments, the predetermined temporal relationship may be based upon the hardware of the deterministic streaming processor, a type of instruction, and/or the like. Because the temporal relationship between data and instructions are known by the compiler, the operand data received by a computational element does not include any metadata indicating what the data is to be used for or where it is to be consumed. Instead, each computational element receives instructions, and based upon the predetermined timing, performs the instruction on the then current data held by a register associated with the computational element. This allows for the data and instructions to flow through the deterministic streaming processor more efficiently.

Embodiments of the present disclosure are directed to a power grid distribution for a deterministic streaming processor (e.g., TSP). The deterministic streaming processor includes a plurality of functional slices, and a plurality of data transport lanes for transporting data across the functional slices along a first spatial dimension. The deterministic streaming processor further includes a plurality of ICUs, wherein an instruction in each subset of the ICUs comprises a functional slice specific operation code and is transported to a corresponding functional slice along a second spatial dimension orthogonal to the first spatial dimension. The deterministic streaming processor further includes a power supply grid of metal traces spreading across the first and second spatial dimensions for supplying power to the functional slices and the ICUs. At least a portion of the metal traces are implemented as discontinuous stubs along the first spatial dimension or the second spatial dimension.

Architectural Overview of Tensor Streaming Processor

In accordance with embodiments of the present disclosure, the deterministic streaming processor plane comprises a TSP, e.g., as may be commercially available from GROQ, INC. of Mountain View, California. It is to be understood that although many embodiments described herein use a TSP as the preferred processors, other deterministic streaming processors may be used in commercial applications. FIG. 1A shows an arrangement of functional slices in a TSP, in accordance with some embodiments.

Certain core architectural elements set the TSP apart from GPU and accelerators. In a conventional chip multiprocessor (CMP), each "computational element" is an independent core that is interconnected using the on-chip network to exchange data between cores. Instruction execution is carried out over several stages: (i) instruction fetch (IF), (ii) instruction decode (ID), (iii) execution (EX) on Arithmetic Logic Units (ALUs), (iv) memory access (MEM), and (v) writeback (WB) to update the results in the general-purpose registers (GPRs).

In contrast from conventional multicore, where each computational element is a heterogeneous collection of functional units but globally homogeneous, the TSP inverts that to have a local functional homogeneity but chip-wide (global) heterogeneity. More specifically, the TSP reorganizes the homogeneous two-dimensional mesh of cores into the functionally sliced microarchitecture shown in FIG. 1A. In this approach, each computational element implements a specific function and is stacked vertically into a specific "functional slice" in one dimension (e.g., the Y-dimension) of the two-dimensional on-chip mesh. The TSP disaggregates the basic elements of the conventional multicore per their respective functions: instruction control and dispatch (e.g., via instruction control unit (ICU)), memory (MEM), integer (INT) arithmetic, float point unit (FPU) arithmetic, and network (NET) interface, as shown by the functional slice labels at the top of FIG. 1A. Each row of the two-dimensional on-chip mesh contains a cross section of all functional slices.

In this organization, each functional slice is independently controlled by a sequence of instructions specific to its on-chip role. For instance, the MEM functional slices support Read and Write but not, necessarily Add or Mul, which are typically performed in arithmetic functional slices (e.g., the vector execution module (VXM) and matrix execution module (MXM) functional slices) for some typical machine learning (ML) algorithms, such as the linear regression algorithm.

All functional slice's computational elements execute the same instruction stream—Single Instruction Multiple Data (SIMD) instructions. Thus, the common instruction decode and dispatch logic can be factored out into its own computational element (e.g., ICU) and decompose the normal instruction execution pipeline into two areas: (i) instruction fetch, decode, and parceling and (ii) operand read, execute, and writeback. This approach decouples the memory subsystem from the functional units retrieving their operands and depositing results.

In some embodiments, each functional slice implements, e.g., a 20-stage vector pipeline that spans the computational elements of each functional slice, with each computational element producing 16 elements of the 320-element maximum vector length. This organization naturally decomposes instruction flow in the vertical dimension, and data flow in the horizontal dimension as the data flow passes over different function types. With this processor organization, instruction execution is carried out by different computational elements: instruction fetching and decoding in the ICU and operand decode, execution and writeback at each computational element of the functional slice as the (vertical flowing) dispatched instruction intersects with the (horizontal flowing) operand data on which the dispatched instruction is operating. It will be appreciated that reference to 'vertical' and 'horizontal' or 'north', 'south', 'east' and 'west' are used in connection with the illustrations shown in the Figures, are abstractions that are solely intended to aid the reader and should not be inferred as technical limitations.

Figure 1B:
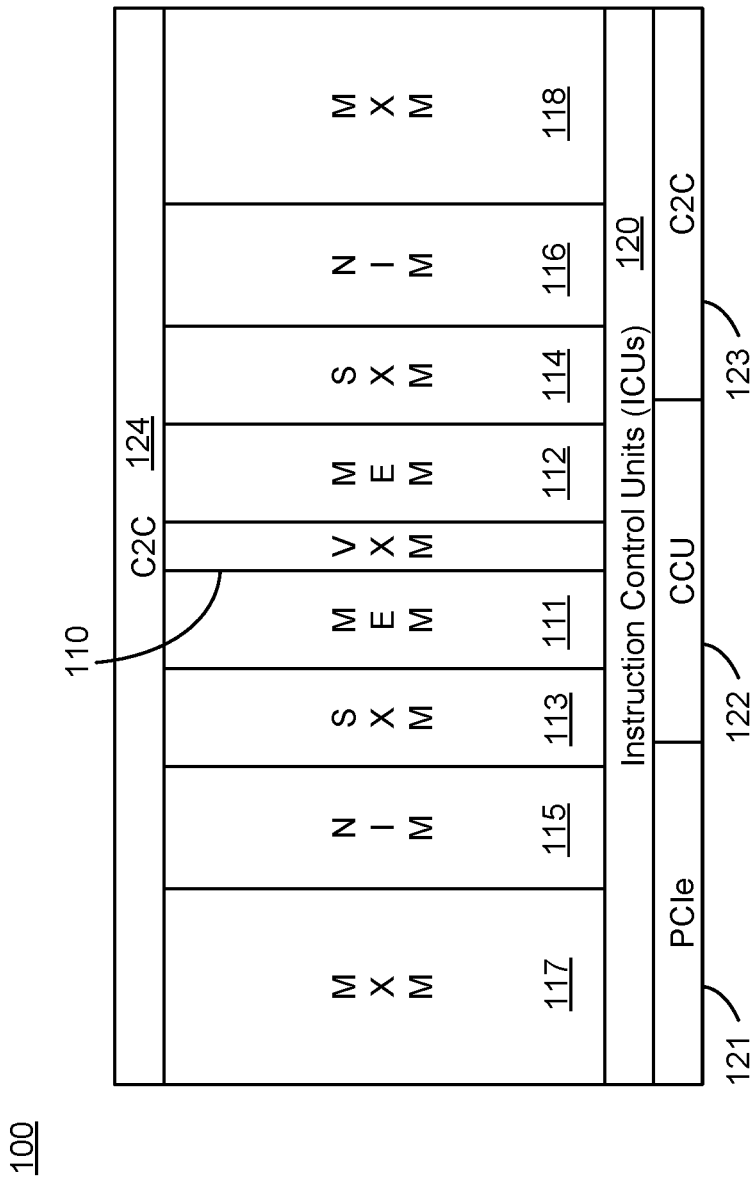
FIG. 1B illustrates an example TSP architecture, in accordance with some embodiments.

FIG. 1B illustrates an example TSP 100, in accordance with some embodiments. The TSP 100 may include memory and arithmetic units optimized for multiplying and adding input data with weight sets (e.g., trained or being trained) for machine learning applications (e.g., training or inference). For example, the TSP 100 includes a VXM 110 for performing operations on vectors (i.e., one-dimensional arrays of values). Other elements of the system are arranged symmetrically on either side of the VXM 110 to optimize processing speed. For example, the VXM 110 is adjacent to MEMS 111-112 and SXMs 113-114 to control routing of data, data domain and presentation controllers (or numerical interpretation modules (NIMs)) 115-116, and MXMs 117-118. An ICU 120 controls the flow of data and execution of operations across blocks 110-118, for example. The TSP 100 may further include communications circuits such as chip-to-chip (C2C) circuits 123-124 and an external communication circuit (e.g., PCIe) 121. The TSP 100 may, for example, further include a chip control unit (CCU) 122 to control boot operations, clock resets, and other low level setup operations.

Figure 1C:
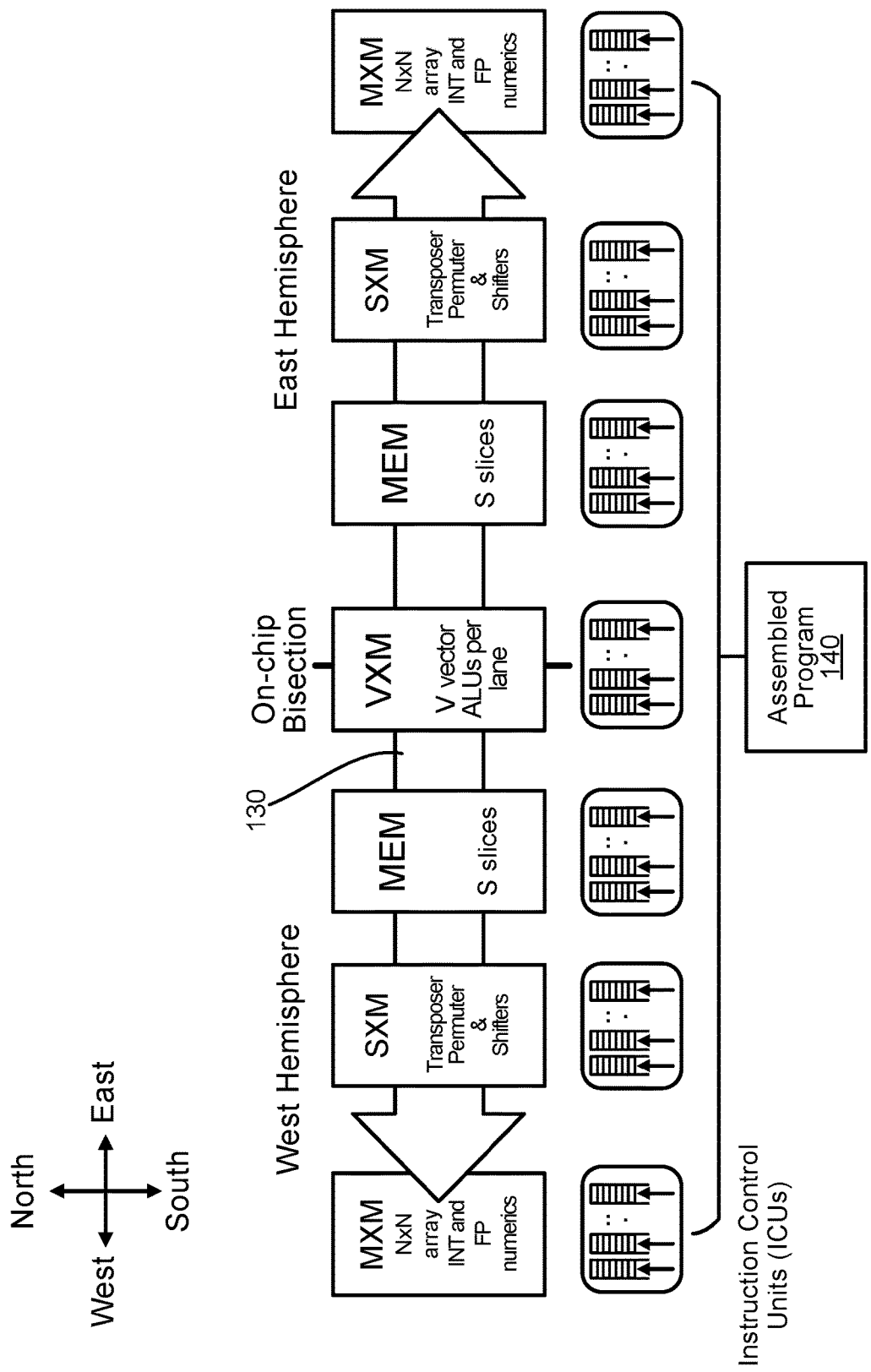
FIG. 1C illustrates organization and data flow within a row of a TSP, in accordance with some embodiments.

FIG. 1C illustrates organization and data flow within a row of the TSP 100, in accordance with some embodiments. As shown in FIG. 1C, each row of the two-dimensional on-chip mesh of the TSP 100 contains a cross section of all functional slices, e.g., N×N array of MXMs (e.g., N=320) configured for both integer (INT) and floating-point (FP) numerics (e.g., INT8 and FP16), S MEM functional slices (S=44), VXM functional slices with V vector ALUs per lane (e.g., V=16), and SXM functional slices. In this organization, each functional slice is independently controlled by a sequence of instructions specific to its on-chip role fetched by a corresponding array of ICUs (e.g., a total of I=144 ICUs). Conceptually, the functional slices are fixed and data 130 are flowing across their computational elements. As the data flows through a specific functional slice, each functional slice can optionally intercept the data operands and compute a result (e.g., in case of MXM and VXM), or move data between data transport lanes on the network (e.g., in case of SXM and MEM). Instructions flow northward from the ICUs to the functional slices, while data (operands and results) primarily flow east and west between functional slices. Any inter-lane data movement within a vector uses the on-chip network functional slice.

It is noted that the "east-west-north-south" directionality is provided herein for ease of discussion and relativity. Furthermore, the "east-west-north-south" directionality is used as a reference for explanation of processing flow as described herein and is not intended to be limited with respect to a label of a particular direction. For example, the north-south direction (i.e., direction along the vertical or Y-dimension) could be reoriented to the east-west direction (i.e., direction along the horizontal or X-dimension) and the principles currently described with east-west directionality could apply to the reoriented north-south directionality. In another example of the directionality not intended to be limited to the description per the reference noted, directionality could be referenced such that north-south is up-down and east west is right-left and the principles would accordingly apply.

In one embodiment, 320 lanes are overlaid on the TSP 100 where each computational element in the on-chip mesh operates on, e.g., 16-lanes in a SIMD manner. The 16-lane unit can be referred to herein as a "superlane" and represents a cross-section of all the functional slices on the chip. As such, a superlane may represent the architecture's minimum vector length (minVL) of, e.g., 16 elements. Likewise, the vertical composition of 20 tiles forming a functional slice may produce a maximum vector length (maxVL) of, e.g., 20×16=320 functional units. Each of the 144 independent on-chip ICUs can issue one or more instructions per clock cycle. The compiler has explicit control of a program order in each instruction queue, e.g., by generating an assembled program 140 for execution by the ICUs and functional slices. There are 64 logical streams per lane for moving operands or results on-chip with, e.g., 32 streams eastward and 32 streams westward. The 220 MB of globally shared SRAM may deliver 32 bytes per lane of stream bandwidth and low-latency access to model parameters. For example, MEM can read and MXM can install more than e.g., 100,000 weights into a 320×320 array (i.e., 320 lanes×320 functional units) in less than 30 clock cycles including SRAM and on-chip network transit delays.

As shown in FIG. 1B and FIG. 1C, the on-chip network is implemented as X-dim mesh and Y-dim mesh of computational elements with X-Y-X dimension order routing. Each instruction specifies the first hop direction (east or west), so memory instruction semantics have both an address and a dataflow direction. Streams are routed in the X-dimension through MEM 111/112 and routed in the Y-dimension using the SXM's 113/114 permuter and lane-shifters to move data elements vertically. The SXM's 113/114 permuter implements a permutation function that is a mathematical technique that determines the number of possible arrangements in a set when the order of the arrangements matters. Common mathematical problems involve choosing only several items from a set of items with a certain order.

The MEM 111/112 and the SXM 113/114 provide deterministic routing of stream data as the stream data flows in the X and Y dimensions, respectively. With the TSP architecture 100, functional slices interact with streams of data in a producer-consumer fashion. That is, the functional slices consume operands from streams and produce results onto a (possibly different) stream, like an assembly line operator (functional slice) and conveyor belt (stream).

Conceptually, the functional slices are fixed and data is flowing across computational elements as shown in FIG. 1C. As the data flows through the functional slice, each computational element can optionally intercept the data operands and compute a result (if the computational element comprises an arithmetic logic unit (ALU)) or move data between lanes on the network if the computational element comprises a switching element.

Streams provide a programming abstraction and are a conduit through which data flows between functional slices. Unlike GPRs, the functional slices operate on streams of parallel data flowing east or west (horizontally) across the chip. The horizontally flowing streams carrying operands intercept the vertically (northward) flowing instructions (see FIG. 1C) to perform a computation at a computational element on a functional slice. A compiler accurately maintains the chip's architectural state and uses that knowledge to ensure that instructions correctly intercept its stream operand(s).

Streams are implemented in hardware by a chip-wide streaming register file. Streams are architecturally visible and transport operands and results between functional slices. A common software pattern involves reading operand data from one or more MEM functional slices that is then subsequently consumed and operated on by a downstream arithmetic functional slice. The results of the operation are then produced onto another stream such that they can be written back to memory or passed to subsequent computational elements. For example, a Z=X+Y operation might require four instructions: Read S1, X and Read S2, Y are executed on two MEM functional slices and directed inward toward an ALU functional slice to perform the Add S1, S2, S3. Lastly, the result is stored back to memory via a Write S3, Z. The streams represent a collection of N-elements, operated upon in a SIMD manner by each functional slice.

By way of example, a TSP architecture makes several deliberate tradeoffs on the hardware-software interface, pushing the complexities associated with scheduling into the compiler. Specifically, it falls on the compiler to precisely schedule instructions to use the hardware correctly and efficiently. At times this may involve selecting one of several means by which an algorithm or meta-operation may be realized on the hardware. Removing the control complexity of dynamic instruction scheduling for multi-issue execution units allows the ICU to be relatively small, accounting for, e.g., less than 3% of the chip area.

Figure 3:
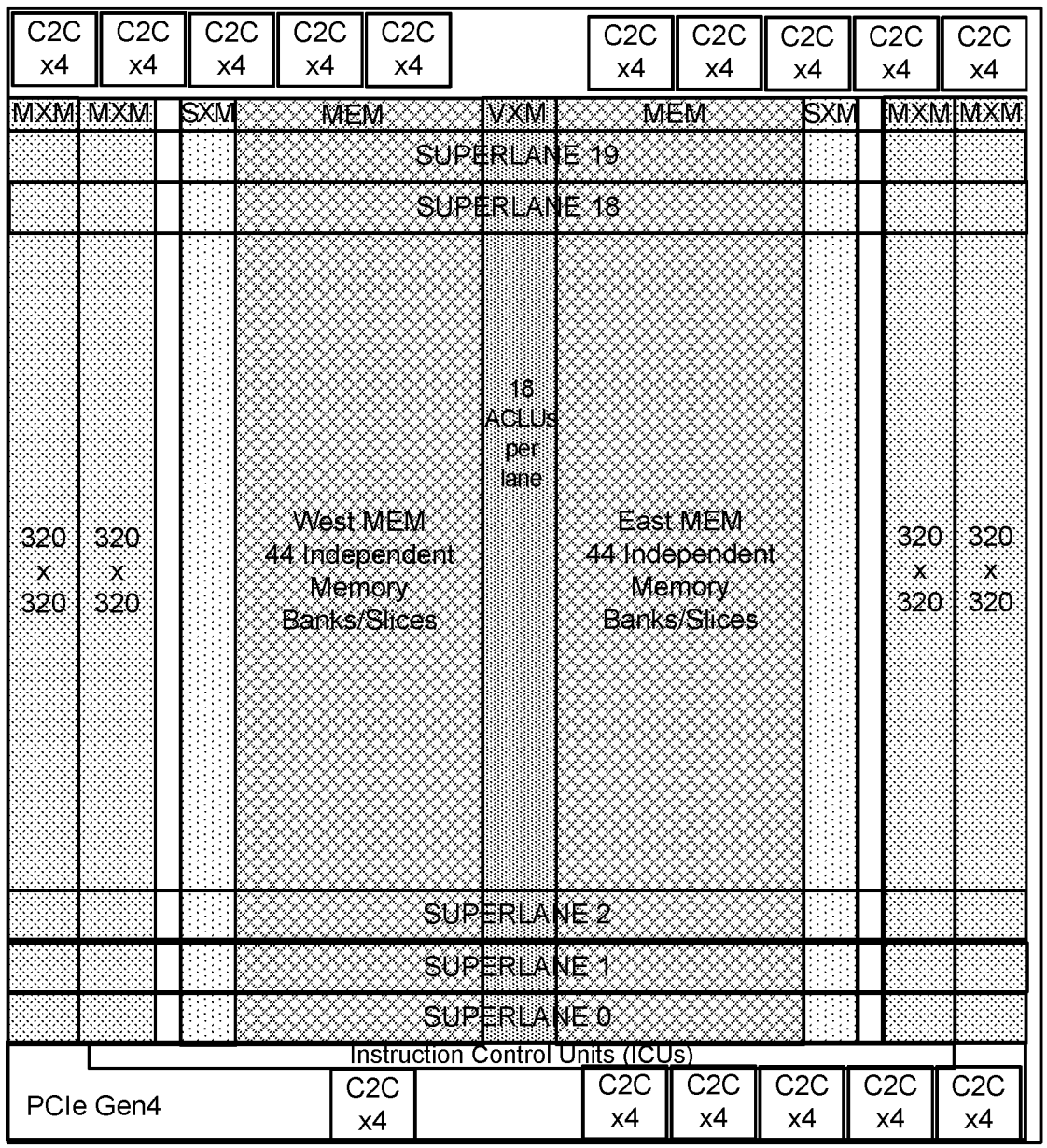
FIG. 3 illustrates a die photo of an ASIC implementation of a TSP, in accordance with some embodiments.

The compiler has access to, e.g., 320-lane programming abstraction overlaid on a TSP architecture (e.g., the TSP 100 in FIG. 1B or a TSP die 300 in FIG. 3) where each computational element in the on-chip mesh operates on 16-lanes in a SIMD manner. The 16-lane unit can be referred to as a "superlane" which is a cross-section of all the functional slices on the chip and the minimum granularity of computation. As such, a superlane represents the architecture's minimum vector length, minVL, of 16 elements. Likewise, the vertical composition of 20 tiles to form a functional slice (see the TSP die 300 in FIG. 3) produces a maximum vector length, maxVL, of 20×16=320 elements.

The compiler has access to, e.g., 144 independent instruction queues (i.e., ICUs) on-chip: (a) six for westward MXM including two independent two-dimensional MAC (multiply-accumulate) arrays; (b) 14 for westward SXM for intra-superlane and inter-lane switching by rearranging elements of vectors; (c) 44 for westward MEM including 44 parallel functional slices of static random-access memory (SRAM); (d) 16 for VXM including 16 vector ALUs per lane; (e) 44 for eastward MEM—including 44 parallel functional slices of SRAM; (f) 14 for eastward SXM; and (g) six for eastward MXM including two independent two-dimensional MAC arrays, whereas each instruction queue can issue one or more instructions per cycle and the compiler has explicit control of the program order in each instruction queue.

Figure 2:
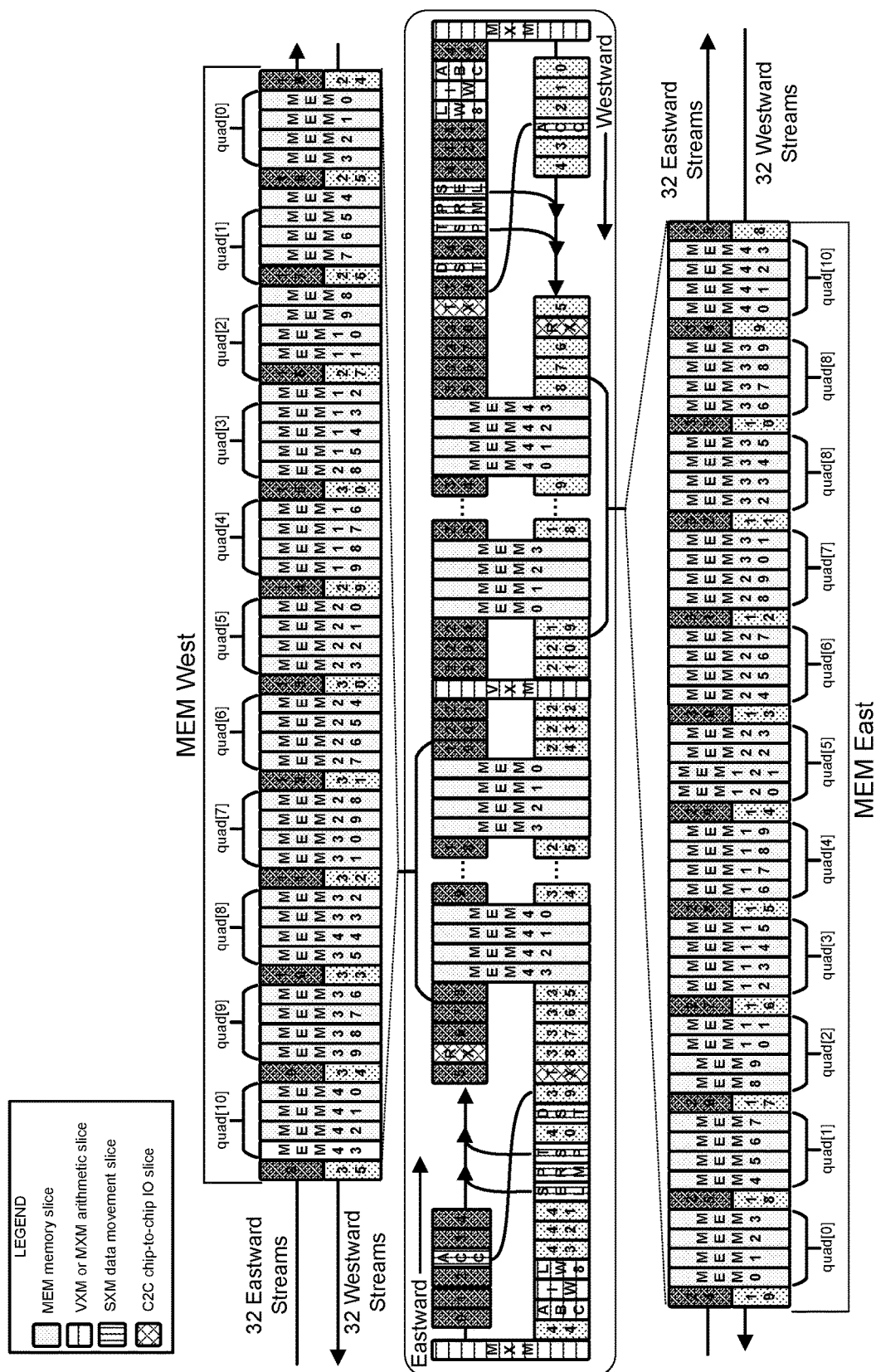
FIG. 2 depicts stream registers of a TSP that are numbered to show their locations between functional slices within a superlane, in accordance with some embodiments.

The compiler has access to, e.g., 64 logical streams per lane. For example, 32 logical streams are required to operate on 16 minVL per lane for moving operands or results on-chip with 32 streams eastward, and 32 streams westward, as shown in FIG. 2.

The compiler has access to, e.g., 220 MBytes of globally shared SRAM, in one embodiment, that delivers 32 bytes per lane of stream bandwidth and low-latency access to model parameters. For example, MEM can read and MXM can install 400K weights into all four 320×320 arrays in less than 40 operational cycles including SRAM and on-chip network transit delay.

Streams are designated by both an identifier (0, . . . , 31) and direction. For example, in(28) designates stream 28 inward, and out(24) designates stream 24 toward the outward edge of the chip. The direction of a stream may be designated as inward (toward the chip bisection) or outward (toward the outward edge of the chip), or the direction may be designated as eastward or westward, as shown in FIG. 1C and FIG. 2.

The components of a superlane are organized spatially as shown in FIG. 1C. The TSP's instruction set architecture (ISA) defines instructions spanning different functional areas. The partitioned global address space (PGAS) presented by the MEM functional slices provides memory semantics for vectors to be addressed from SRAM and loaded into an architecturally visible stream with a direction of dataflow toward the functional slice intending to operate on them.

The first functional area (i.e., ICU) provides explicit instruction fetching with IFetch instruction(s), and inter-slice synchronization using Sync and Notify instructions to perform chip-wide barrier synchronization among participating functional slices. A repeated-NOP (no-op) instruction allows for precise cycle-by-cycle control of inter-instruction delay. For example, the compiler has cycle-accurate control when scheduling two operations A and B using an intervening NOP so that N cycles separate them, e.g., OpA NOP(N) OpB.

The second functional area (i.e., VXM) consists of a 4×4 mesh of ALUs in each lane for pointwise arithmetic operations.

The third functional area (i.e., MXM) consists of four independent two-dimensional MAC arrays that operate on, e.g., INT8, FP16 or FP32 data types.

On-chip data movement uses the fourth functional area (i.e., SXM) for intra-superlane and inter-lane switching by rearranging elements of vectors. The SXM is analogous to the NET interface to communicate between cores in FIG. 1A. Together the MEM and SXM work in tandem to form the X-Y dimensional movement of data across the on-chip network.

The fifth functional area (i.e., the east and west hemisphere of on-chip MEM module) is composed of 44 parallel MEM functional slices of SRAM and provides the memory access concurrency necessary to fully utilize the 32 streams in each East or West direction. Each functional slice provides 13-bits of physical addressing of 16-byte memory words, each byte maps to a lane, for a total of 220 MBytes of on-chip SRAM.

An additional sixth functional area includes C2C modules configured to provide Send and Receive primitives for exchanging 320-byte vectors between a pair of TSP chips. One possible TSP implementation (see the TSP die 300 in FIG. 3) has, e.g., a total of 16×4 links operating at 30 Gbps each for a total off-chip bandwidth of 16×4×30 Gbps×2 directions=3.84 Tb/s (Tera-bytes per second) of off-chip pin bandwidth that can be flexibly partitioned to support high-radix interconnection networks of TSPs for large-scale systems. The host interface for peripheral component interconnect express (PCIe) Gen4 may be also handled in this module. The host interface provides a lightweight direct memory access (DMA) engine to emplace a model onto the TSP memory and provides an entry point for bootstrapping the model execution. The host interface also provides a general mechanism for passing interrupts to the host, which may be necessary in the event a multi-bit memory error is observed, for example.

Table I provides a summary of example instructions for each functional slice, in accordance with some embodiments.

TABLE I

SUMMARY OF INSTRUCTIONS FOR EACH FUNCTIONAL SLICE

| | Instruction | Description |
|---|---|---|
| ICU | NOP N | No-operation, can be repeated N times to delay by N cycles |
| | Ifetch | Fetch instructions from streams or local memory |
| | Sync | Parks at the head of the instruction dispatch queue to await barrier notification |
| | Notify | Releases the pending barrier operations causing instruction flow to resume |
| | Config | Configure low-power mode |
| | Repeat n, d | Repeat the previous instruction n times, with d cycles between iterations |
| MEM | Read a, s | Load vector at address a onto stream s |
| | Write a, s | Store stream s register contents into main memory address a |
| | Gather s, map | Indirectly read addresses pointed to by map putting onto stream s |
| | Scatter s, map | Indirectly store stream s into address in the map stream |
| VXM | unary operation | z = op x pointwise operation on 1 operand, x, producing 1 result, z (e.g., mask, negate) |
| | binary operation type | z = x op y pointwise operations with 2 operands x and y producing 1 result, z (e.g., add, mul, sub) |
| | conversions | Converting fixed point to floating point, and vice versa |
| | ReLU | Rectified linear unit activation function max(0, x) |
| | TanH | Hyperbolic tangent - activation function |
| | Exp | Exponentiation $e^x$ |
| | RSqrt | Reciprocal square root |
| MXM | LW | Load weights (LW) from streams to weight buffer |
| | IW | Install weights (IW) from streams or LW buffer into the 320 × 320 array |
| | ABC | Activation buffer control (ABC) to initiate and coordinate arriving activations |
| | ACC | Accumulate (ACC) either INT32 or FP32 result from MXM |
| SXM | Shift up/down N | Lane-shift streams up/down by N lanes, and Select between North/South shifted vectors |
| | Permute map | Bijective permute 320 inputs $\xrightarrow{map}$ outputs |
| | Distributemap | Rearrange or replicate data within a superlane (16 lanes) |
| | Rotate stream | Rotate n × n input data to generate $n^2$ output streams with all possible rotations (n = 3 or n = 4) |
| | Transpose sg16 | Transpose 16 × 16 elements producing 16 output streams with rows and columns interchanged |
| C2C | Deskew | Manage skew across plesiochronous links |
| | Send | Send a 320-byte vector |
| | Receive | Receive a 320-byte vector, emplacing it in main memory |

A sequence of instructions performed on different functional slices can be chained to create more complex actions without the need to write back intermediate results to memory. This allows efficient processing of streams at full bandwidth and lowest latency.

Machine learning algorithms typically operate on vectors with coefficients of a specified data type (e.g., INT8, FP16, etc.). These vectors may be interpreted as an abstraction over the underlying data, whose elements can be processed by the same operation in a SIMD manner. The TSP operates on vectors, sometimes organized into rank-2 tensors, and relies on the graph-lowering compiler to transform higher rank tensors into rank-2 tensors.

The TSP's programming model is a producer-consumer model where each functional slice acts as a consumer and a producer of one or more streams. When a vector is read from a main memory, the vector is given a stream identifier (0, . . . , 31) and direction: eastward, or westward. Once the vector is read into a stream register it is a stream and is "flowing" in the given direction in the following sense: given spatially adjacent functional slices at coordinates $x_0$, $x_1$, $x_2$ (where the spatial coordinate increases in the direction of flow), then at a given time $t_i$, the vector representing stream $s_1$ at functional slice $x_1$ can be accessed as operands by that functional slice. Similarly, the functional slices at $x_0$ and $x_2$ will have access to different stream values for the same stream register. In the following cycle $t_{i+1}$, the value $s_1$ either propagates to the functional slice at $x_2$, or else the value $s_1$ is overwritten with a result $r_1$ produced by the functional slice at $x_1$ at cycle t. Similarly, the stream value $s_0$ that was present to be consumed by the functional slice at coordinate $x_0$ at time $t_i$ will be (absent $x_0$ overwriting the value at time $t_i$) available in the next cycle $t_{i+1}$ to the functional slice at $x_1$. Stream operands are steered toward the functional slice that is consuming them and producing a result stream. Streams are constantly flowing across the chip, serving as how functional slices communicate with one another. FIG. 2 provides a graphical depiction of the interleaving of functional units and stream registers that combine to support this programming model In the TSP programming model, an instruction is issued on a functional slice at a given compiler-scheduled time t and executes as a SIMD operation on stream-supplied operand vectors (e.g., of up to 320-elements), producing vectors of the same length on result streams. For example, at the micro-architectural level, the 320-element SIMD instruction is pipelined across the vertical stack of computational elements in the functional slice. That is, at the scheduled time t, the instruction would be issued to the bottom-most computational element of the functional slice, e.g., corresponding to the first 16-element superlane of operand/result vectors. In the subsequent operational cycle, the instruction would be propagated to the next computational element northward in the functional slice, which in turn executes the instruction on the next 16-element super lane of operand vectors. This process continues cycle-by-cycle until the process has traversed, e.g., all 20 computational elements in the functional slice. The combination of vertical instruction pipelining described above, along with the need for operands and instructions to coincide at a precise time, results in a spatial "stagger" of SIMD operand and result data.

Power Grid Distribution for Deterministic Processors

Embodiments of the present disclosure relate to an integrated circuit with a power supply grid spreading across first and second spatial dimensions of the integrated circuit for supplying power to various active elements (e.g., functional units) of the integrated circuit. At least a portion of the metal traces are routed as discontinuous stubs along the first spatial dimension or the second spatial dimension. The integrated circuit may be a deterministic streaming processor, such as the TSP commercially available from GROQ, INC, e.g., the TSP 100 of FIG. 1B or the TSP 300 of FIG. 3.

An integrated circuit of high level of complexity and density (such as the TSP 100 or the TSP 300) requires substantial power supply to operate. For example, typical integrated circuit operating voltages may range from approximately 1V to 5V. Providing this power requires the use of metal layers disposed upon the deterministic streaming processor to mitigate the reduction of operating voltage due to "IR drop," that represents a diminished voltage when current, "I," flows through a conductor having a finite resistance, "R."

Figure 4:
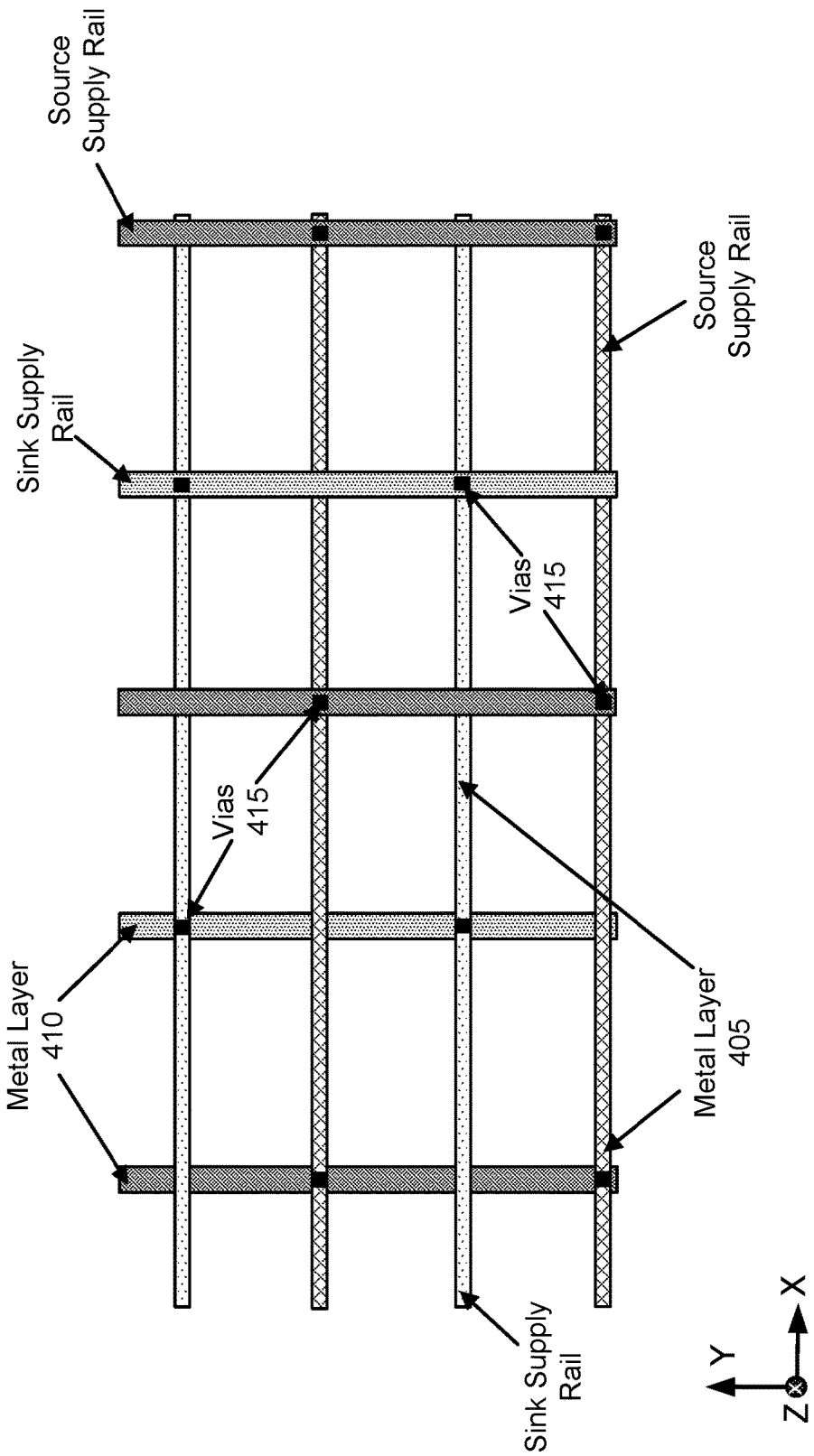
FIG. 4 illustrates an example power grid tile with continuous metal traces disposed on a TSP, in accordance with some embodiments.

FIG. 4 illustrates an example power grid tile 400 with continuous metal traces disposed on an integrated circuit, in accordance with some embodiments. The integrated circuit may be a deterministic streaming processor, such as the TSP 100 or the TSP 300. In order to supply power to various active elements of the integrated circuit with a relatively consistent operating voltage, a power grid structure as depicted in FIG. 4 may be utilized for at least a portion of metal layers in the integrated circuit. The power grid tile 400 can be also referred to as "power grid tile with rails."

The power grid tile 400 may represent a portion of a power supply grid disposed on the integrated circuit. While the power supply grid of the integrated circuit includes metal traces spread across first and second spatial dimensions (e.g., X and Y axes) of the integrated circuit that belong to a plurality of metal layers (e.g., more than ten metal layers), the power grid tile 400 represents a portion of the power supply grid with metal traces belonging to a pair of metal layers 405 and 410. The metal layer 405 may be a layer of a lower level relative to the metal layer 410, and metal traces of the metal layer 405 may be positioned spatially beneath (e.g., along Z axis) metal traces of the metal layer 410. For example, the metal layer 405 may be a metal layer of level N, and metal layer 410 can be a metal layer of level N+1, where, e.g., N≥2.

As shown in FIG. 4, multiple metal traces for a source supply rail (or sink supply rail) of the metal layer 405 may be connected to a single metal trace for a source supply rail (or sink supply rail) of the metal layer 410 using multiple via connectors 415 along a third spatial dimension (e.g., along the Z axis) orthogonal to the first and second spatial dimensions (e.g., X and Y axes). Similarly, multiple metal traces for a source supply rail (or sink supply rail) of the metal layer 410 may be connected to a single metal trace for a source supply rail (or sink supply rail) of the metal layer 405 using multiple via connectors 415 along the third spatial dimension. Advantageously, the power grid tile 400 can be made symmetric about the X axis, Y axis, or both X and Y axes. In this way, the IR drop of the power supply grid can be made more regular and predictable across the integrated circuit (e.g., across the first and second spatial dimensions of the TSP 100 or the TSP 300). Alternatively, in some embodiments, the power grid tile 400 is asymmetric about the X axis, Y axis, or both X and Y axes. For example, a power grid density, usage, and supply percentage may vary for different types of supplies of the power grid tile 400 (e.g., between VDD, VDDM and VSS supply rails in MEM functional slices).

A source supply rail in the power grid tile 400 may be a positive (voltage or current) supply rail, and a sink supply rail in the power grid tile 400 may be a ground, neutral or negative (voltage or current) supply rail. The integrated circuit with the power grid tile 400 may include two or more supply rails for each metal layer used in the power grid tile 400. Examples of supply rails in the power grid tile 400 may include a VDD supply rail, VDDM supply rail, VSS supply rail, VDDIO supply rail, VDDIO2 supply rail, VDDREF supply rail, VSSIO supply rail, VDDanalog supply rail, VSSanalog supply rail, or some other type of supply rail.

Figure 5:
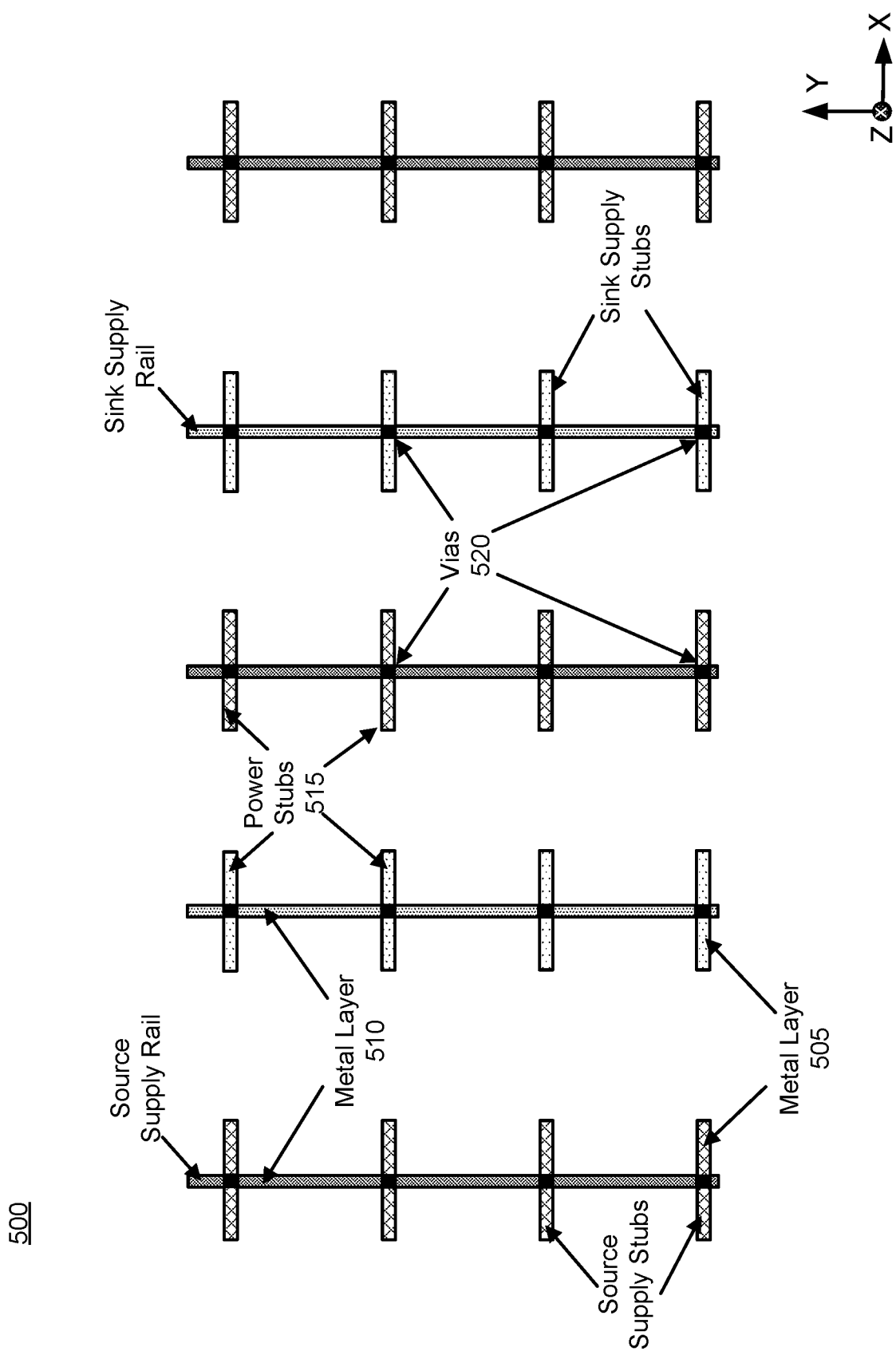
FIG. 5 illustrates a power grid tile of metal traces disposed on a TSP, some of which are discontinuous, in accordance with some embodiments.

FIG. 5 illustrates a power grid tile 500 of metal traces disposed on an integrated circuit, with some of the metal traces being discontinuous, in accordance with some embodiments. The power grid tile 500 represents a portion of the full power supply grid of the integrated circuit having metal traces belonging to one pair of metal layers, i.e., metal layers 505 and 510. The metal layer 505 may be a layer of a lower level relative to the metal layer 510, and metal traces of the metal layer 505 may be positioned spatially beneath (e.g., along the Z axis) metal traces of the metal layer 510. For example, the metal layer 505 may be a metal layer of level M, and the metal layer 510 can be a metal layer of level M+1, where, e.g., M≥2 and M≠N. It can be observed from FIG. 5 that a portion of the metal traces of the power grid tile 500 (i.e., metal traces belonging to the metal layer 505) are discontinuous along one spatial dimension of the integrated circuit (e.g., along the X axis), and can be referred to as power stubs 515. The power grid tile 500 can be also referred to as a "power grid tile with stubs." Thus, metal traces of the metal layer 505 are routed as discontinuous power stubs 515 along one spatial dimension of the integrated circuit.

Multiple metal traces (i.e., multiple power stubs 515) for a source supply stubs (or sink supply stubs) of the metal layer 505 may be connected to a single metal trace for a source supply rail (or sink supply rail) of the metal layer 510 using multiple via connectors 520 along a third spatial dimension (e.g., along the Z axis) orthogonal to the first and second spatial dimensions (e.g., X and Y axes). Similarly, multiple metal traces for a source supply rail (or sink supply rail) of the metal layer 510 may be connected to a single metal trace (i.e., single power stub 505) for a source supply stub (or sink supply stub) of the metal layer 505 using multiple via connectors 520 along the third spatial dimension. Each power stub 515 of the metal layer 505 has a shorter length along the first spatial dimension (e.g., along the X axis) compared to a length of the corresponding metal trace of the metal layer 510 along the second spatial dimension (e.g., along the Y axis).

A source supply stub in the power grid tile 500 may be a positive (voltage or current) supply stub, and a sink supply stub in the power grid tile 500 may be a ground, neutral or negative (voltage or current) supply stub. The integrated circuit may include two or more supply stubs for a metal layer of a pair of metal layers used in the power grid tile 500. Examples of supply stubs in the power grid tile 500 may include a VDD supply stub, VDDM supply stub, VSS supply stub, VDDIO supply stub, VDDIO2 supply stub, VDDREF supply stub, VSSIO supply stub, VDDanalog supply stub, VSSanalog supply stub, or some other type of supply stub. Similarly, the integrated circuit may include two or more supply rails for another metal layer of the pair of metal layers used in the power grid tile 500. Examples of supply rails in the power grid tile 500 may include a VDD supply rail, VDDM supply rail, VSS supply rail, VDDIO supply rail, VDDIO2 supply rail, VDDREF supply rail, VSSIO supply rail, VDDanalog supply rail, VSSanalog supply rail, or some other type of supply rail.

It can be observed that the use of power stubs 515 in the power grid tile 500 along one spatial dimension (e.g., along the X axis) instead of continuous rails in the power grid tile 400 requires extra vias 520 (i.e., extra conductors along the Z axis). However, the extra vias 520 advantageously have less resistance in comparison with the resistance of continuous metal traces along that one spatial dimension (e.g., e.g., along the X axis). A resistance of a via connector 520 along the third spatial dimension (e.g., along the Z axis) is substantially less than a resistance of a metal trace of the power grid tile 500 along the first spatial dimension (e.g., along X axis) or the second spatial dimension (e.g., along Y axis). Lower resistance of the vias 520 in comparison with the resistance of metal traces mitigates the IR drop of the power supply grid. Additionally, the power grid tile 500 may be made symmetric about the X axis, Y axis, or both X and Y axes. In this way, the IR drop of the power supply grid can be made more regular and predictable across the first and second spatial dimensions of the integrated circuit (e.g., TSP 100 or the TSP 300). Alternatively, in some embodiments, the power grid tile 500 is asymmetric about the X axis, Y axis, or both X and Y axes. For example, a power grid density, usage, and supply percentage may vary for different types of supplies of the power grid tile 500 (e.g., between VDD, VDDM and VSS supply stubs or supply rails in MEM functional slices).

The power supply grid of the integrated circuit (e.g., of the TSP 100 or the TSP 300) may include at least one power grid tile 400 and at least one power grid tile 500. Metal traces for a subset of the metal layers in the integrated circuit can be spread across the first and second spatial dimensions as one or more power grid tiles 400, while metal traces for a remainder of the metal layers in the integrated circuit can be spread across the first and second spatial dimensions as one or more power grid tiles 500. In other words, the power supply grid of the integrated circuit may be implemented as a combination of at least one power grid tile 400 and at least one power grid tile 500. For example, in one embodiment, the power supply grid of the integrated circuit includes three power grid tiles 500 (e.g., for metal layers 2 and 3, metal layers 6 and 7, metal layers 8 and 9), as well as five power grid tiles 400 (e.g., for metal layers 4 and 5, metal layers 10 and 11, metal layers 12 and 13, metal layers 14 and 15, metal layers 16 and 17). Additionally, metal traces of a higher level metal layer may be wider than metal traces of a lower level metal layer. For example, metal traces of layers 12 and 13 are approximately three times wider than metal traces of layers 3 and 4, metal traces of layers 14 and 15 are approximately six times wider than metal traces of layers 3 and 4, and metal traces of layers 16 and 17 are approximately more than 21 times wider than metal traces of layers 3 and 4. Consequently, vias that connect corresponding metal layers of different levels can be of different sizes (e.g., different widths).

Figure 6:
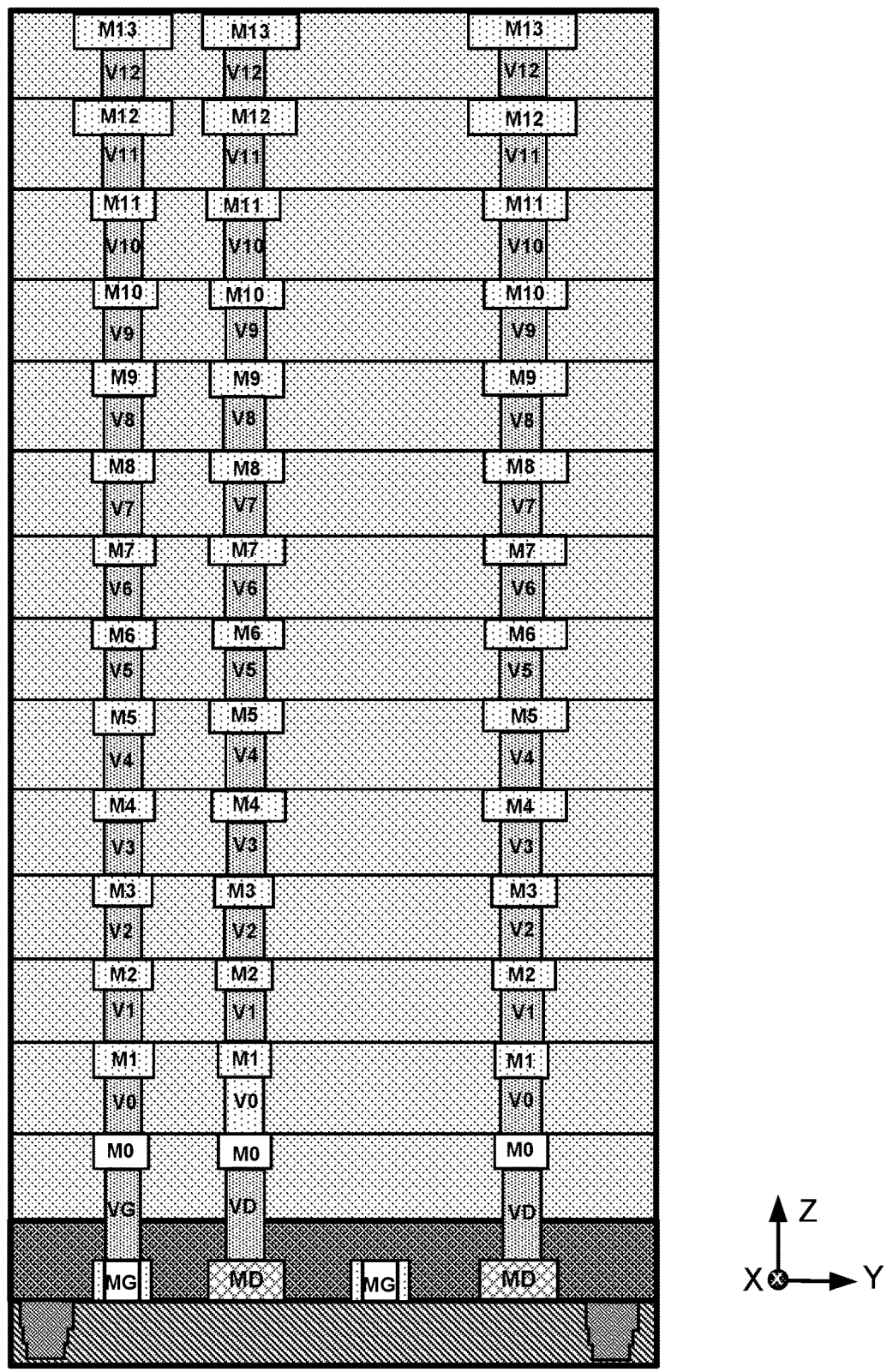
FIG. 6 illustrates an example cross section of metal layers in a TSP connected through via connectors, in accordance with some embodiments.

FIG. 6 illustrates an example cross section 600 of metal layers in an integrated circuit connected through via connectors, in accordance with some embodiments. The integrated circuit may be a deterministic streaming processor, such as the TSP 100 or the TSP 300. The cross section 600 illustrates one possible embodiment of the integrated circuit with 14 metal layers (e.g., metal layers M0, M1, . . . , M13). However, the integrated circuit can have less metal layers (e.g., 12 or 11 metal layers) or more metal layers (e.g., 17 or 19 metal layers). The cross section 600 shows that each two adjacent metal layers are mutually connected along one spatial dimension (e.g., along a depth of the integrated circuit or the Z axis) using corresponding via connectors (e.g., vias V0, V1, . . . , V12). In some embodiments, corresponding spatial dimensions (e.g., the spatial dimensions along the X and Y axes) of a via connector connecting two lower metal layers (e.g., via connector V3 or V4) may be smaller than that of another via connector connecting two upper metal layers (e.g., via connector V11 or V12), e.g., by approximately up to 16 times for each of the spatial dimensions.

Example Process Flow

FIG. 7 is a flowchart illustrating a method 700 of routing a power grid for an integrated circuit with a deterministic streaming processor, in accordance with some embodiments. The integrated circuit can further include at least one computer processor and a non-transitory computer-readable storage medium for storing computer executable instructions. The deterministic streaming processor may be a TSP. The deterministic streaming processor may be an embodiment of the TSP 100 or an embodiment of the TSP 300.

The operations of method 700 may be initiated by a compiler operating on at least one computer processor and/or on a host server separate from the integrated circuit. Alternatively, the operations of method 700 may be initiated by a compiler operating on the at least one computer processor and/or on the host server. The compiler may utilize as its input a model (e.g., a machine learning model) for the deterministic streaming processor and outputs instructions for configuring operation of the deterministic streaming processor and the integrated circuit as a whole.

At 710, a power supply grid of metal traces for the deterministic streaming processor may be routed across a first spatial dimension and a second spatial dimension orthogonal to the first spatial dimension for supplying power to a plurality of functional slices of the deterministic streaming processor and a plurality of ICUs of the deterministic streaming processor. At 720, at least a portion of the metal traces may be routed as discontinuous stubs along the first spatial dimension or the second spatial dimension. The deterministic streaming processor with the routed power supply grid may further include a plurality of data transport lanes configured to transport data across the functional slices along the first spatial dimension. Additionally, an instruction in each subset of the ICUs may comprise a functional slice specific operation code for configuring transportation of the instruction to a corresponding functional slice along the second spatial dimension.

The power supply grid deterministic streaming processor may include a plurality of metal layers, and at least one of the metal layers may include a set of metal traces routed as discontinuous stubs along the first spatial dimension or the second spatial dimension. Each metal trace from the set may be connected to a corresponding metal trace of another metal layer of the plurality of metal layers using a via connector along a third spatial dimension orthogonal to the first and second spatial dimensions. A resistance of the via connector along the third spatial dimension may be less than a resistance of any metal trace of the power supply grid along the first spatial dimension or the second spatial dimension. A first portion of the discontinuous metal traces may comprise a plurality of source supply stubs (e.g., source voltage or source current supply stubs) and a second portion of the discontinuous metal traces may comprise a plurality of sink supply stubs (e.g., sink voltage or sink current supply stubs).

A first subset of the metal traces spreading across the first spatial dimension may be discontinuous along the first spatial dimension, and a second subset of the metal traces spreading across the second spatial dimension may be continuous along the second spatial dimension. Each metal trace from the first subset may be connected to a corresponding metal trace from the second subset using a via connector along a third spatial dimension orthogonal to the first and second spatial dimensions. Each metal trace from the first subset may be of a shorter length along the first spatial dimension compared to a length of the corresponding metal trace from the second subset along the second spatial dimension. The first subset of metal traces may belong to a first of the plurality of metal layers, and the second subset of metal traces may belong to a second of the plurality of metal layers. The first metal layer comprising the first subset of discontinues metal traces may be positioned spatially beneath the second metal layer comprising the second subset of continuous metal traces. A metal trace from the second subset may be connected to multiple metal traces from the first subset using a plurality of via connectors along a third spatial dimension orthogonal to the first and second spatial dimensions. The power supply grid of metal traces may be symmetrical about a first axis and/or a second axis orthogonal to the first axis.

Example Computer System Architecture

Figure 8A:
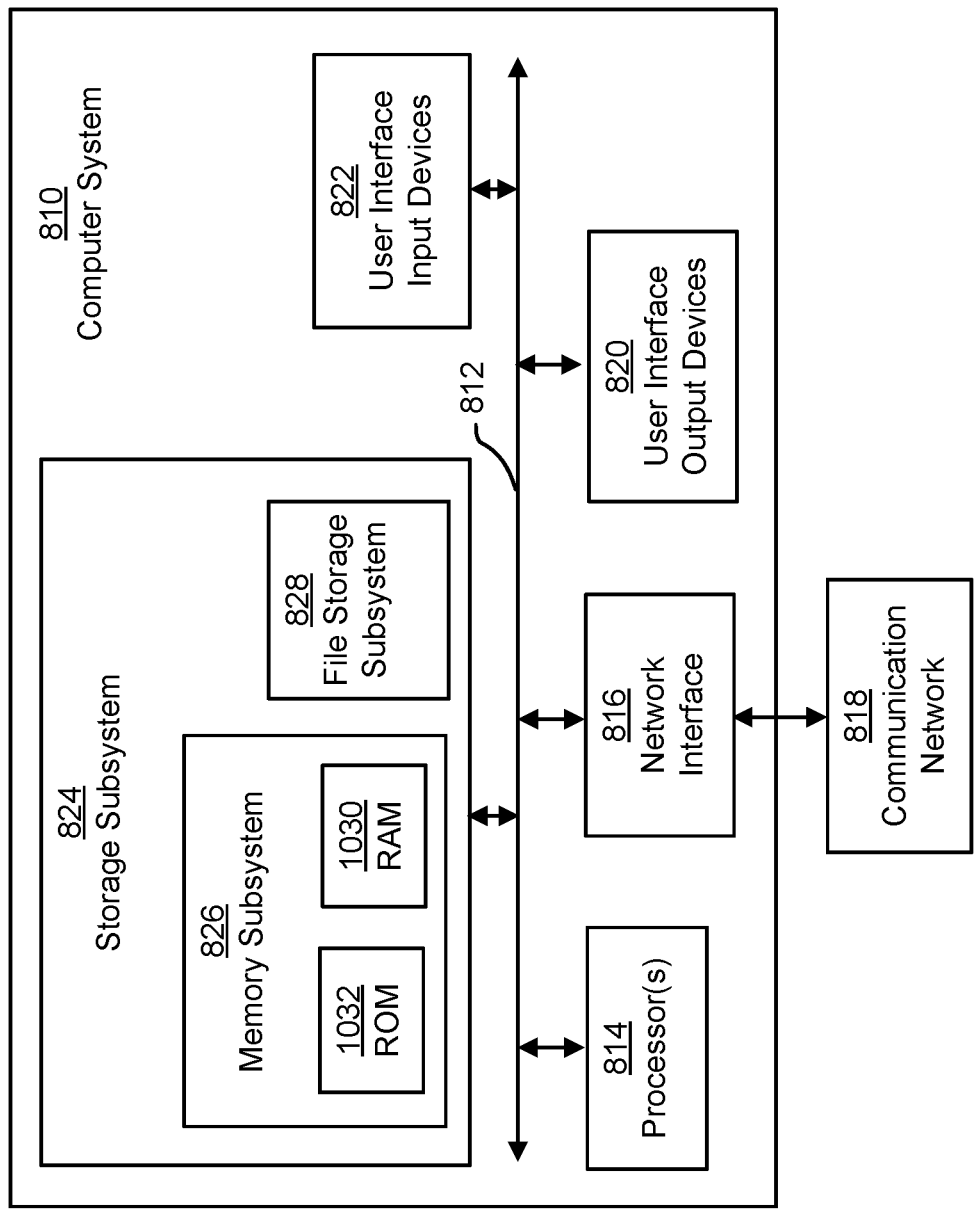
FIG. 8A is an abstract diagram of an example computer system suitable for enabling embodiments of the claimed disclosures for use in commerce, in accordance with some embodiments.

FIG. 8A is an abstract diagram of an example computer system suitable for enabling embodiments of the claimed disclosures, in accordance with some embodiments. In some embodiments described herein, a host processor may comprise the computer system of FIG. 8A.

In FIG. 8A, the structure of computer system 810 typically includes at least one computer 814 which communicates with peripheral devices via bus subsystem 812. Typically, the computer includes a processor (e.g., a microprocessor, graphics processing unit, or digital signal processor), or its electronic processing equivalents, such as an ASIC or FPGA. Typically, peripheral devices include a storage subsystem 824, comprising a memory subsystem 826 and a file storage subsystem 828, user interface input devices 822, user interface output devices 820, and/or a network interface subsystem 816. The input and output devices enable direct and remote user interaction with computer system 810. The computer system enables significant post-process activity using at least one output device and/or the network interface subsystem.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, for example, MICROSOFT WINDOWS, APPLE MACOS and IOS, GOOGLE ANDROID, Linux and/or Unix. The computer system typically includes a Basic Input/Output System (BIOS) and processor firmware. The operating system, BIOS and firmware are used by the processor to structure and control any subsystems and interfaces connected to the processor. Example processors that enable these operating systems include: the Pentium, Itanium, and Xeon processors from INTEL; the Opteron and Athlon processors from AMD (ADVANCED MICRO DEVICES); the Graviton processor from AMAZON; the POWER processor from IBM; the SPARC processor from ORACLE; and the ARM processor from ARM Holdings.

Any embodiment of the present disclosure is limited neither to an electronic digital logic computer structured with programs nor to an electronically programmable device. For example, the claimed embodiments can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system 810 depicted in FIG. 8A is intended only as an example. Many other structures of computer system 810 have more components than the computer system depicted in FIG. 8A.

Network interface subsystem 816 provides an interface to outside networks, including an interface to communication network 818, and is coupled via communication network 818 to corresponding interface devices in other computer systems or machines. Communication network 818 can comprise many interconnected computer systems, machines and physical communication connections (signified by 'links'). These communication links can be wireline links, optical links, wireless links (e.g., using the WiFi or Bluetooth protocols), or any other physical devices for communication of information. Communication network 818 can be any suitable computer network, for example a wide area network such as the Internet, and/or a local-to-wide area network such as Ethernet. The communication network is wired and/or wireless, and many communication networks use encryption and decryption processes, such as is available with a virtual private network. The communication network uses one or more communications interfaces, which receive data from, and transmit data to, other systems. Embodiments of communications interfaces typically include an Ethernet card, a modem (e.g., telephone, satellite, cable, or Integrated Services Digital Network (ISDN)), (asynchronous) digital subscriber line (DSL) unit, Firewire interface, universal serial bus (USB) interface, and the like. Communication algorithms ('protocols') can be specified using one or more communication languages, such as Hypertext Transfer Protocol (HTTP), Transmission Control Protocol/Internet Protocol (TCP/IP), Real-time Transport Protocol/Real Time Streaming Protocol (RTP/RTSP), Internetwork Packet Exchange (IPX) protocol and/or User Datagram Protocol (UDP).

User interface input devices 822 can include an alphanumeric keyboard, a keypad, pointing devices such as a mouse, trackball, toggle switch, touchpad, stylus, a graphics tablet, an optical scanner such as a bar code reader, touchscreen electronics for a display device, audio input devices such as voice recognition systems or microphones, eye-gaze recognition, brainwave pattern recognition, optical character recognition systems, and other types of input devices. Such devices are connected by wire or wirelessly to a computer system. Typically, the term 'input device' signifies all possible types of devices and processes to transfer data and information into computer system 810 or onto communication network 818. User interface input devices typically enable a user to select objects, icons, text and the like that appear on some types of user interface output devices, for example, a display subsystem.

User interface output devices 820 can include a display subsystem, a printer, a fax machine, or a non-visual communication device such as audio and haptic devices. The display subsystem can include a CRT, a flat-panel device such as an LCD, an image projection device, or some other device for creating visible stimuli such as a virtual reality system. The display subsystem can also provide non-visual stimuli such as via audio output, aroma generation, or tactile/haptic output (e.g., vibrations and forces) devices. Typically, the term 'output device' signifies all possible types of devices and processes to transfer data and information out of computer system 810 to the user or to another machine or computer system. Such devices are connected by wire or wirelessly to a computer system. Note that some devices transfer data and information both into and out of the computer, for example, haptic devices that generate vibrations and forces on the hand of a user while also incorporating sensors to measure the location and movement of the hand. Technical applications of the sciences of ergonomics and semiotics are used to improve the efficiency of user interactions with any processes and computers disclosed herein, such as any interactions with regards to the design and manufacture of circuits that use any of the above input or output devices.

Memory subsystem 826 typically includes several memories including a main RAM 830 (or other volatile storage device) for storage of instructions and data during program execution and a ROM 832 in which fixed instructions are stored. File storage subsystem 828 provides persistent storage for program and data files, and can include a hard disk drive, a floppy disk drive along with associated removable media, a CD-ROM drive, an optical drive, a flash memory such as a USB drive, or removable media cartridges. If computer system 810 includes an input device that performs optical character recognition, then text and symbols printed on a physical object (such as paper) can be used as a device for storage of program and data files. The databases and modules used by some embodiments can be stored by file storage subsystem 828.

Bus subsystem 812 provides a device for transmitting data and information between the various components and subsystems of computer system 810. Although bus subsystem 812 is depicted as a single bus, alternative embodiments of the bus subsystem can use multiple buses. For example, a main memory using RAM can communicate directly with file storage systems using DMA systems.

Figure 8B:
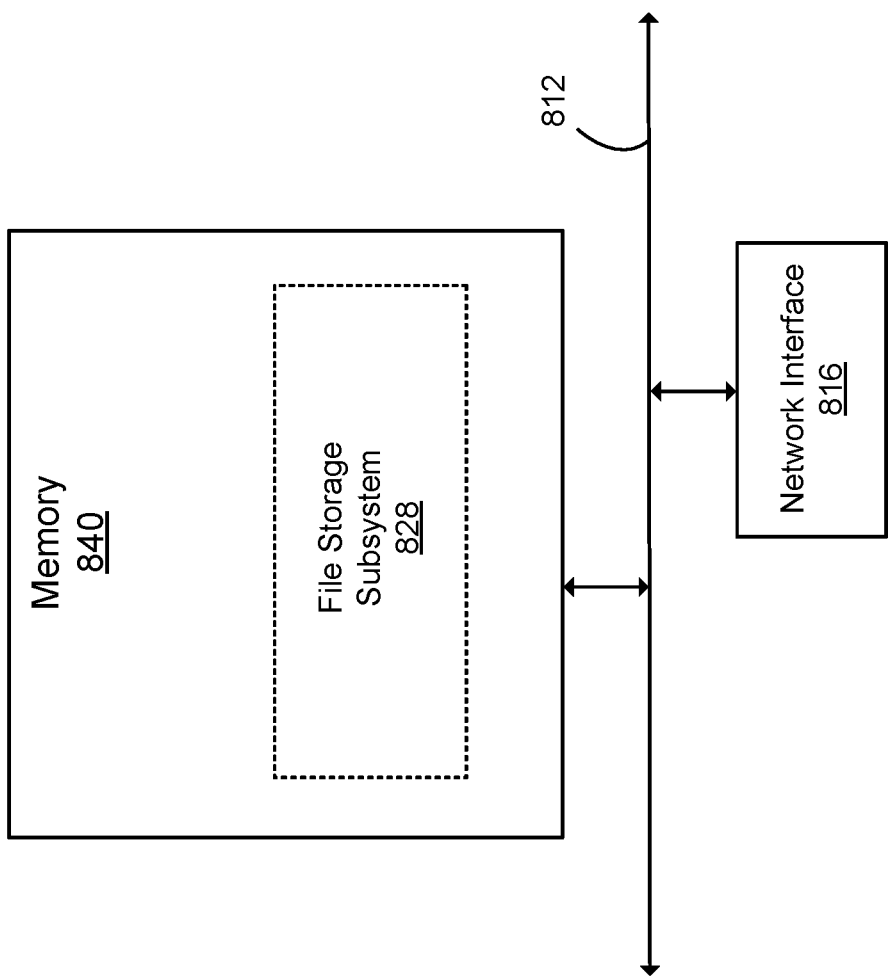
FIG. 8B is another abstract diagram of an example computer system suitable for enabling embodiments of the claimed disclosures for use in commerce, in accordance with some embodiments.

FIG. 8B is another abstract diagram of a computer system suitable for enabling embodiments of the claimed disclosures, in accordance with some embodiments. In some embodiments described herein, a host processor may comprise the computer system of FIG. 8B.

FIG. 8B depicts a memory 840 such as a non-transitory, processor readable data and information storage medium associated with file storage subsystem 828, and/or with network interface subsystem 816 (e.g., via bus subsystem 812), and can include a data structure specifying a circuit design. The memory 840 can be a hard disk, a floppy disk, a CD-ROM, an optical medium, removable media cartridge, or any other medium that stores computer readable data in a volatile or non-volatile form, such as text and symbols on a physical object (such as paper) that can be processed by an optical character recognition system. A program transferred into and out of a processor from such a memory can be transformed into a physical signal that is propagated through a medium (such as a network, connector, wire, or circuit trace as an electrical pulse); or through a medium such as space or an atmosphere as an acoustic signal, or as electromagnetic radiation with wavelengths in the electromagnetic spectrum longer than infrared light).

One skilled in the art will recognize that any of the computer systems illustrated in FIGS. 8A-8B comprises a machine for performing a process that achieves an intended result by managing work performed by controlled electron movement.

Additional Example Computing System

Figure 9:
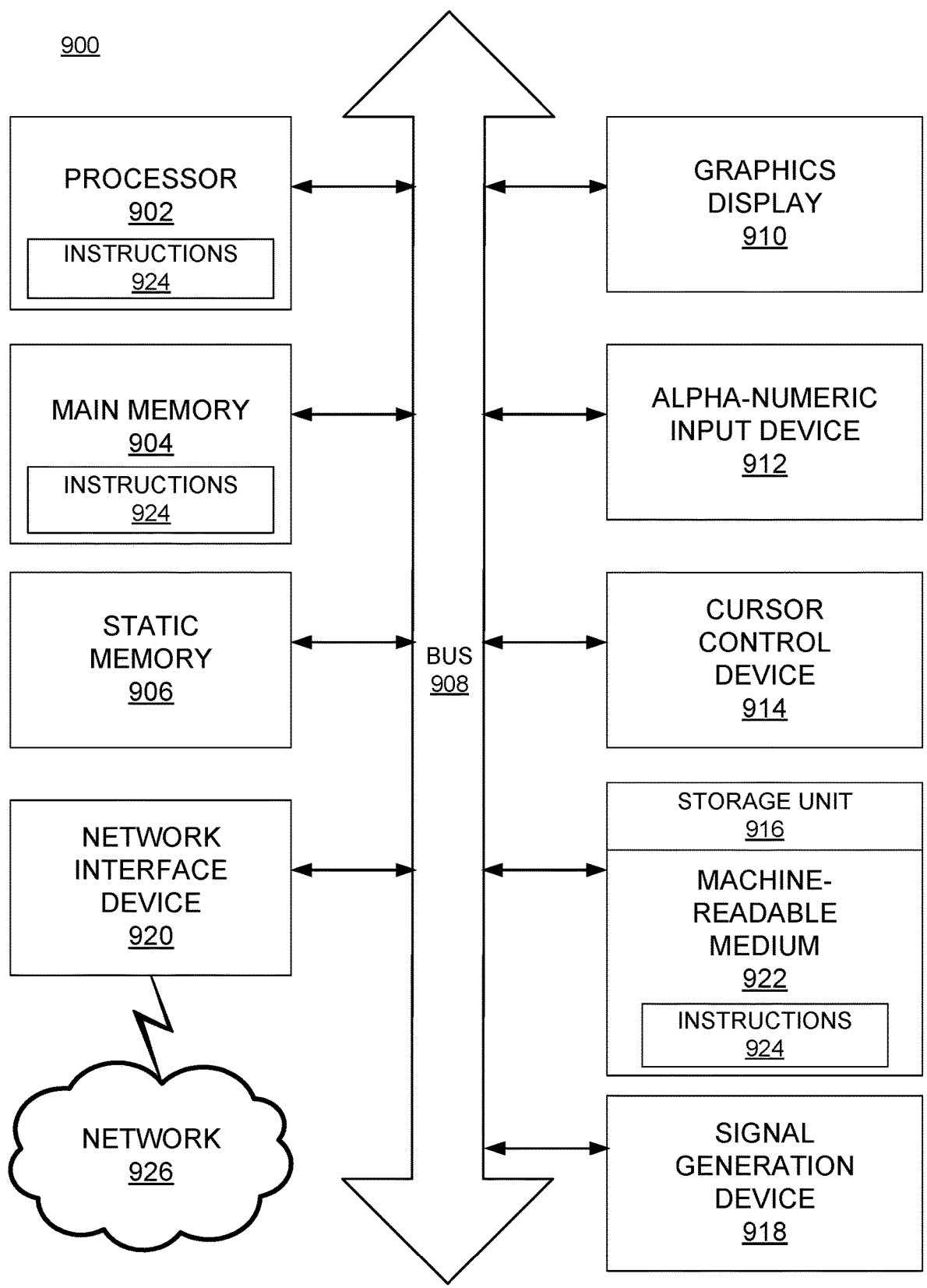
FIG. 9 illustrates an additional example computing machine for use in commerce, in accordance with some embodiments.

FIG. 9 is a block diagram illustrating components of an example computing machine that is capable of reading instructions from a computer-readable medium and executing them in a processor (or controller) according to an embodiment. A computer described herein may include a single computing machine shown in FIG. 9, a virtual machine, a distributed computing system that includes multiple nodes of computing machines shown in FIG. 9, or any other suitable arrangement of computing devices. The computer described herein may be used by any of the elements described in the previous figures to execute the described functions.

By way of example, FIG. 9 depicts a diagrammatic representation of a computing machine in the example form of a computer system 900 within which instructions 924 (e.g., software, program code, or machine code), which may be stored in a computer-readable medium, causing the machine to perform any one or more of the processes discussed herein. In some embodiments, the computing machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The structure of a computing machine described in FIG. 9 may correspond to any software, hardware, or combined components shown in the figures above. By way of example, a computing machine may be a tensor streaming processor designed and manufactured by GROQ, INC. of Mountain View, California, a personal computer (PC), a tablet PC, a set-top box (STB), a personal digital assistant (PDA), a cellular telephone, a smartphone, a web appliance, a network router, an internet of things (IoT) device, a switch or bridge, or any machine capable of executing instructions 924 that specify actions to be taken by that machine. Further, while only a single machine is illustrated, the term "machine" shall also be taken to include any collection of machines that individually or jointly execute instructions 924 to perform any one or more of the methodologies discussed herein.

The example computer system 900 includes one or more processors (generally, a processor 902) (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 904, and a static memory 906, which are configured to communicate with each other via a bus 908. The computer system 900 may further include graphics display unit 910 (e.g., a plasma display panel (PDP), a liquid crystal display (LCD), a projector, or a cathode ray tube (CRT)). The computer system 900 may also include alphanumeric input device 912 (e.g., a keyboard), a cursor control device 914 (e.g., a mouse, a trackball, a joystick, a motion sensor, or other pointing instrument), a storage unit 916, a signal generation device 918 (e.g., a speaker), and a network interface device 920, which also are configured to communicate via the bus 908.

The storage unit 916 includes a computer-readable medium 922 on which the instructions 924 are stored embodying any one or more of the methodologies or functions described herein. The instructions 924 may also reside, completely or at least partially, within the main memory 904 or within the processor 902 (e.g., within a processor's cache memory). Thus, during execution thereof by the computer system 900, the main memory 904 and the processor 902 may also constitute computer-readable media. The instructions 924 may be transmitted or received over a network 926 via the network interface device 920.

While the computer-readable medium 922 is shown in an example embodiment to be a single medium, the term "computer-readable medium" should be taken to include a single medium or multiple media (e.g., a centralized or distributed database, or associated caches and servers) able to store instructions (e.g., the instructions 924). The computer-readable medium 922 may include any medium that is capable of storing instructions (e.g., the instructions 924) for execution by the machine and that cause the machine to perform any one or more of the methodologies disclosed herein. The computer-readable medium 922 may include, but not be limited to, data repositories in the form of solid-state memories, optical media, and magnetic media. The computer-readable medium 922 does not include a transitory medium such as a signal or a carrier wave.

Additional Considerations

The disclosed configurations may have benefits and advantages that include, for example, a more efficient data flow by separating the functions of the processor into specialized functional units, and configuring the timing of data and instructions to each functional unit, such that each unit is able operate on received data based upon a known timing between received data and instructions. Because the compiler for the processor is hardware aware, it is able to configure an explicit plan for the processor indicating how and when instructions and data operands are transmitted to different tiles of the processor. By accounting for the timing of received instructions and data, the data can be transmitted between the tiles of the processor without unnecessary metadata, increasing the efficiency of the transmission. In addition, by separating the transmission of data and instructions, instructions can be iterated and looped independent of received data operands.

In addition, because each computational element of the processor is dedicated to a specific function (e.g., MEM, VXM, MXM, SXM), the amount of instructions needed to be processed by the computational elements may be reduced. For example, certain computational elements (e.g., in MXM functional slice) may be configured to perform a limited set of operations on any received data. As such, these computational elements may be able to operate without having to receive explicit instructions or only receiving intermittent or limited instructions, potentially simplifying operation of the processor. For example, data operands read from memory can be intercepted by multiple functional slices as the data is transmitted across a data lane, allowing for multiple operations to be performed on the data in a more efficient manner.

In operation, a host computer programs a DMA engine to actually transfer data, again all of which is coordinated by the runtime layer. Specifically, the IDU transfers 320-byte vectors from PCIe-Gen4 32-bytes every core-clock cycle (e.g., nominal 900 Mhz). Thus, the 320-element vector arrives over a period of 10 cycles and placed on multiple streams moving towards the MEM. The incoming streams flow on S24-31 (upper eight streams), from which the MEM performs a "write" to commit that vector to SRAM. Hence, a PCI-Receive consists of (i) receiving the data from the PCI interface, and (ii) writing the vector into the specified functional slice of the MEM.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Some embodiments of the present disclosure may further relate to a system comprising a processor (e.g., a tensor streaming processor or an artificial intelligence processor), at least one computer processor (e.g., a host server), and a non-transitory computer-readable storage medium. The storage medium can store computer executable instructions, which when executed by the compiler operating on the at least one computer processor, cause the at least one computer processor to be operable for performing the operations and techniques described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A processor comprising:
    a plurality of functional slices;
    a plurality of data transport lanes for transporting data across the functional slices along a first spatial dimension;
    a plurality of instruction control units (ICUs), an instruction in each subset of the ICUs comprising a functional slice specific operation code and is transported to a corresponding functional slice along a second spatial dimension orthogonal to the first spatial dimension; and
    a power supply grid of metal traces spreading across the first and second spatial dimensions for supplying power to the functional slices and the ICUs, at least a portion of the metal traces being discontinuous along the first spatial dimension or the second spatial dimension.

2. The processor of claim 1, wherein the power supply grid comprises a plurality of metal layers, at least one of the metal layers having a set of metal traces discontinuous along the first spatial dimension or the second spatial dimension.

3. The processor of claim 2, wherein each metal trace from the set is connected to a corresponding metal trace of another metal layer of the plurality of metal layers using a via connector along a third spatial dimension orthogonal to the first and second spatial dimensions.

4. The processor of claim 3, wherein a resistance of the via connector along the third spatial dimension is less than a resistance of any metal trace of the power supply grid along the first spatial dimension or the second spatial dimension.

5. The processor of claim 2, wherein a first portion of the discontinuous metal traces comprise a plurality of source supply stubs and a second portion of the discontinuous metal traces comprise a plurality of sink supply stubs.

6. The processor of claim 1, wherein a first subset of the metal traces spreading across the first spatial dimension are discontinuous along the first spatial dimension, and a second subset of the metal traces spreading across the second spatial dimension are continuous along the second spatial dimension.

7. The processor of claim 6, wherein each metal trace from the first subset is connected to a corresponding metal trace from the second subset using a via connector along a third spatial dimension orthogonal to the first and second spatial dimensions.

8. The processor of claim 7, wherein each metal trace from the first subset has a shorter length along the first spatial dimension compared to a length of the corresponding metal trace from the second subset along the second spatial dimension.

9. The processor of claim 6, wherein the first subset of metal traces belong to a first of the plurality of metal layers, and the second subset of metal traces belong to a second of the plurality of metal layers.

10. The processor of claim 9, wherein the first metal layer comprising the first subset of discontinues metal traces is positioned spatially beneath the second metal layer comprising the second subset of continuous metal traces.

11. The processor of claim 6, wherein a metal trace from the second subset is connected to multiple metal traces from the first subset using a plurality of via connectors along a third spatial dimension orthogonal to the first and second spatial dimensions.

12. The processor of claim 1, wherein the power supply grid of metal traces is symmetric about a first axis and a second axis orthogonal to the first axis.

13. The processor of claim 1, wherein the power supply grid of metal traces is asymmetric about at least one of a first axis and a second axis orthogonal to the first axis.

14. A method comprising:
    routing a power supply grid of metal traces across a first spatial dimension and a second spatial dimension orthogonal to the first spatial dimension for supplying power to a plurality of functional slices of the processor and a plurality of instruction control units (ICUs) of the processor; and
    routing at least a portion of the metal traces as discontinuous stubs along the first spatial dimension or the second spatial dimension, wherein
    a plurality of data transport lanes of the processor are configured to transport data across the functional slices along the first spatial dimension, and
    an instruction in each subset of the ICUs comprises a functional slice specific operation code and is configured for transportation to a corresponding functional slice along the second spatial dimension.

15. The method of claim 14, further comprising:
    routing the power supply grid using a plurality of metal layers, at least one of the metal layers having a set of metal traces routed as discontinuous stubs along the first spatial dimension or the second spatial dimension; and
    connecting each metal trace from the set to a corresponding metal trace of another metal layer of the plurality of metal layers using a via connector along a third spatial dimension orthogonal to the first and second spatial dimensions.

16. The method of claim 14, further comprising:
routing a first subset of the metal traces across the first spatial dimension as discontinuous stubs; and
routing a second subset of the metal traces across the second spatial dimension as continuous rails.

17. The method of claim 16, further comprising:
routing each metal trace from the first subset to have a shorter length along the first spatial dimension compared to a length of a corresponding metal trace from the second subset along the second spatial dimension; and
connecting each metal trace from the first subset to the corresponding metal trace from the second subset using a via connector along a third spatial dimension orthogonal to the first and second spatial dimensions.

18. The method of claim 16, further comprising:
connecting a metal trace from the second subset to multiple metal traces from the first subset using a plurality of via connectors along a third spatial dimension orthogonal to the first and second spatial dimensions.

19. A non-transitory computer-readable storage medium having stored thereon executable instructions, which when executed by a computer processor cause the computer processor to:
route a power supply grid of metal traces across a first spatial dimension and a second spatial dimension orthogonal to the first spatial dimension for supplying power to a plurality of functional slices of the processor and a plurality of instruction control units (ICUs) of the processor; and
route at least a portion of the metal traces as discontinuous stubs along the first spatial dimension or the second spatial dimension, wherein
a plurality of data transport lanes of the processor are configured to transport data across the functional slices along the first spatial dimension, and
an instruction in each subset of the ICUs comprises a functional slice specific operation code and is configured for transportation to a corresponding functional slice along the second spatial dimension.

20. The non-transitory computer-readable storage medium of claim 19, further comprising instructions that when executed by the computer processor further cause the computer processor to:
route the power supply grid using a plurality of metal layers, at least one of the metal layers having a set of metal traces routed as discontinuous stubs along the first spatial dimension or the second spatial dimension; and
connect each metal trace from the set to a corresponding metal trace of another metal layer of the plurality of metal layers using a via connector along a third spatial dimension orthogonal to the first and second spatial dimensions.

* * * * *